United States Patent
Inokuchi et al.

(10) Patent No.: US 7,649,767 B2
(45) Date of Patent: Jan. 19, 2010

(54) SPIN-INJECTION MAGNETIC RANDOM ACCESS MEMORY

(75) Inventors: Tomoaki Inokuchi, Kawasaki (JP); Yoshiaki Saito, Kawasaki (JP); Hideyuki Sugiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/132,664

(22) Filed: Jun. 4, 2008

(65) Prior Publication Data

US 2008/0247223 A1 Oct. 9, 2008

Related U.S. Application Data

(62) Division of application No. 11/373,303, filed on Mar. 13, 2006, now Pat. No. 7,394,684.

(30) Foreign Application Priority Data

Oct. 28, 2005 (JP) .............................. 2005-315459

(51) Int. Cl.
 *G11C 11/00* (2006.01)
(52) U.S. Cl. ...................................... 365/158; 365/157
(58) Field of Classification Search ................. 365/158, 365/157
 See application file for complete search history.

(56) References Cited

U.S. PATENT DOCUMENTS

| | | | |
|---|---|---|---|
| 6,256,223 B1 | 7/2001 | Sun | |
| 6,611,405 B1 | 8/2003 | Inomata et al. | |
| 6,751,074 B2 | 6/2004 | Inomata et al. | |
| 6,958,927 B1 | 10/2005 | Nguyen et al. | |
| 6,987,653 B2 | 1/2006 | Inomata et al. | |
| 7,006,375 B2 | 2/2006 | Covington | |
| 7,038,894 B2 | 5/2006 | Inomata et al. | |
| 7,119,410 B2 | 10/2006 | Saito et al. | |
| 7,200,037 B2 | 4/2007 | Saito et al. | |
| 7,239,541 B2 | 7/2007 | Saito et al. | |
| 7,345,852 B2 | 3/2008 | Inomata et al. | |
| 2004/0246775 A1 | 12/2004 | Covington | |
| 2005/0104101 A1 | 5/2005 | Sun et al. | |
| 2006/0133136 A1* | 6/2006 | Iwata | 365/158 |
| 2006/0203539 A1* | 9/2006 | Ikeda et al. | 365/158 |
| 2008/0062580 A1 | 3/2008 | Inokuchi et al. | |

FOREIGN PATENT DOCUMENTS

| | | |
|---|---|---|
| JP | 2001-156357 | 6/2001 |
| JP | 2003-318367 | 11/2003 |
| JP | 2006-54046 | 2/2006 |
| JP | 2007-87524 | 4/2007 |

OTHER PUBLICATIONS

W.C. Jeong, et al., "Highly Scalable MRAM Using Field Assisted Current Induced Switching", 2005 Symposium on VLSI Technology Digest of Technical Papers, 10B-1, pp. 184-185.

(Continued)

*Primary Examiner*—Vu A Le
(74) *Attorney, Agent, or Firm*—Oblon, Spivak, McClelland, Maier & Neustadt, L.L.P.

(57) ABSTRACT

A spin-injection magnetic random access memory of an aspect of the present invention includes a magnetoresistive element, a unit which writes data into the magnetoresistive element by use of spin-polarized electrons generated by a spin-injection current and which applies, to the magnetoresistive element, a magnetic field of a direction of a hard magnetization of the magnetoresistive element during the writing.

21 Claims, 26 Drawing Sheets

OTHER PUBLICATIONS

Yiming Huai, et al., "Observation of Spin-Transfer Switching in Deep Submicron-Sized and Low-Resistance Magnetic Tunnel Junctions", Applied Physics Letters, vol. 84, No. 16, Apr. 19, 2004, pp. 3118-3120.

T. Ochiai, et al., "Substantial Reduction of Critical Current Density for CPP-GMR with an Antisymmetric Structure", ES-08, Abstracts of the 49th MMM Conference, p. 271, 2008.

S. Haneda, et al., "Current Induced Magnetic Switching in Nanopillar with Two Pinned Layers," HA-05, Abstracts of the 49th MMM Conference, p. 394, 2008.

G.D. Fuchs, et al., "Spin Transfer Effects in Magnetic Tunnel Junctions", HA-12, Abstracts of the 49th MMM Conference, p. 396, 2008.

* cited by examiner

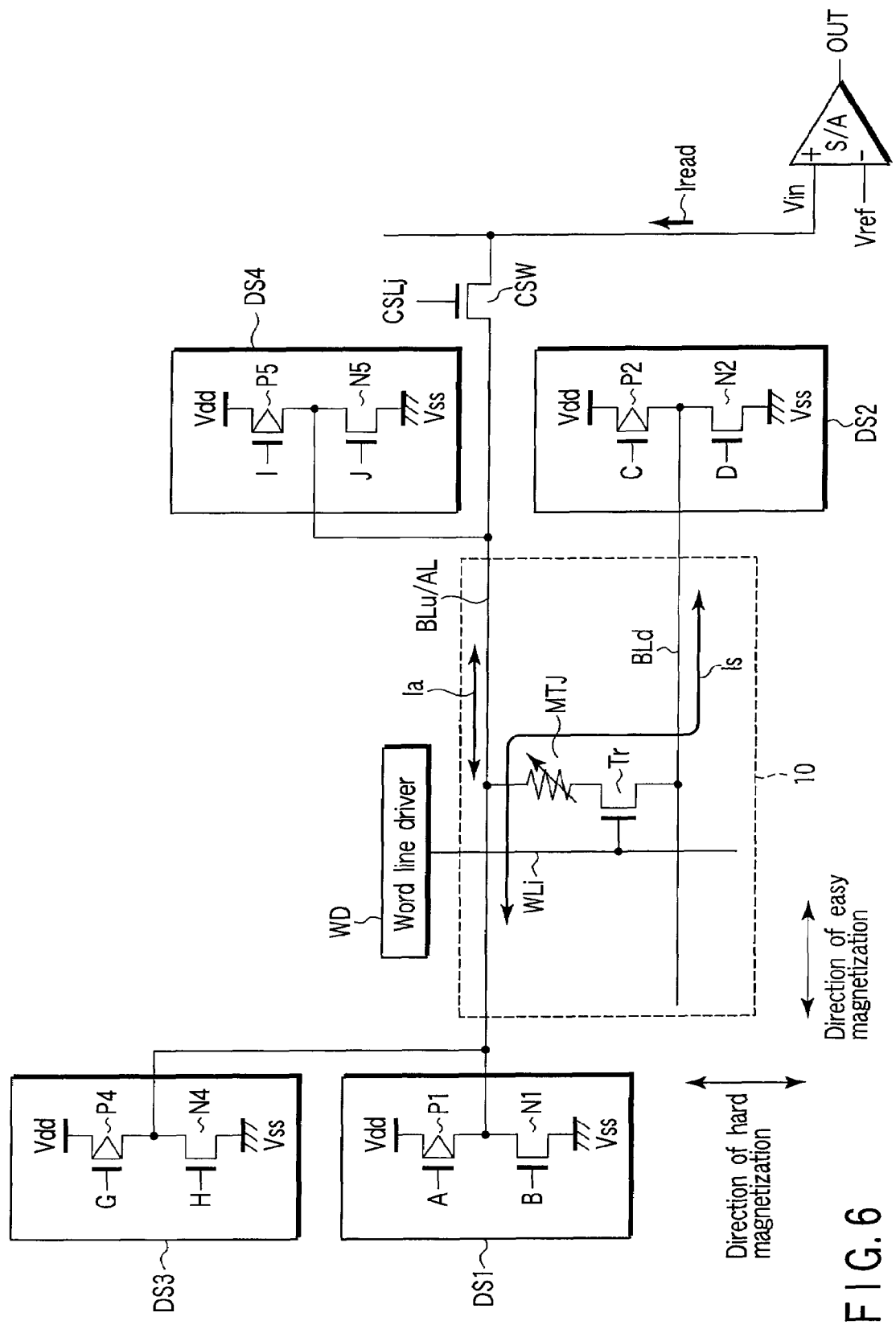
F I G. 6

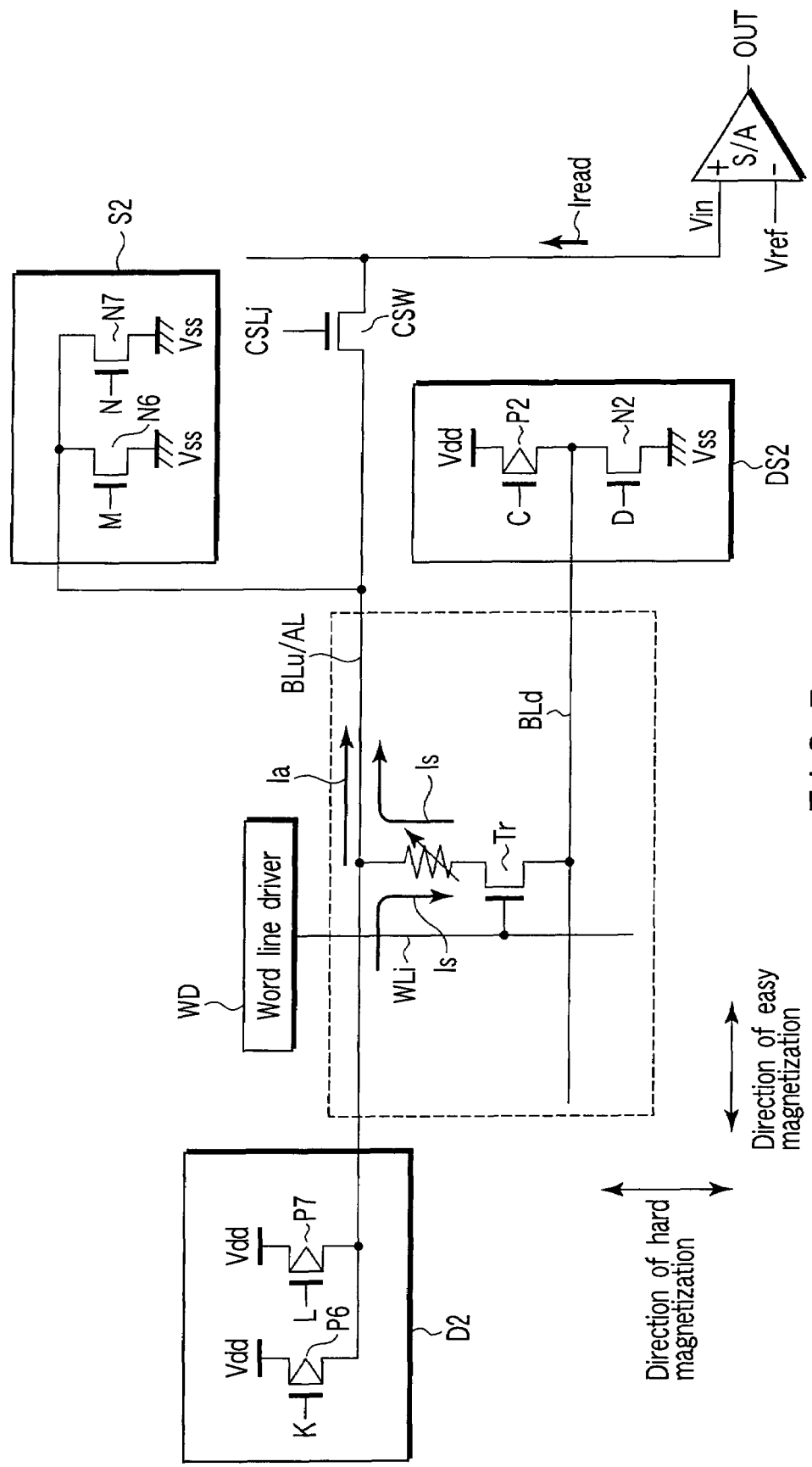
F I G. 7

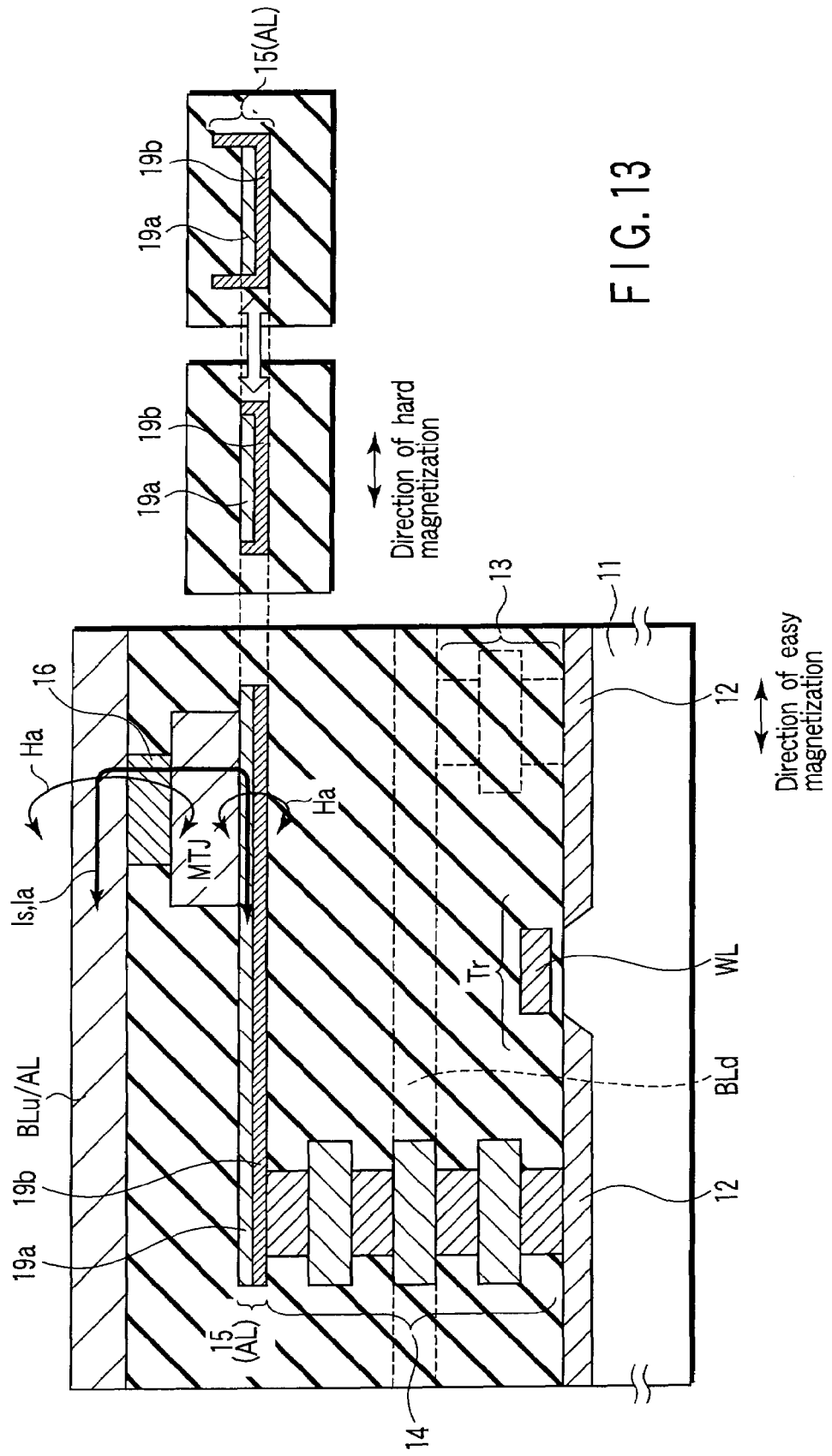
F I G. 13

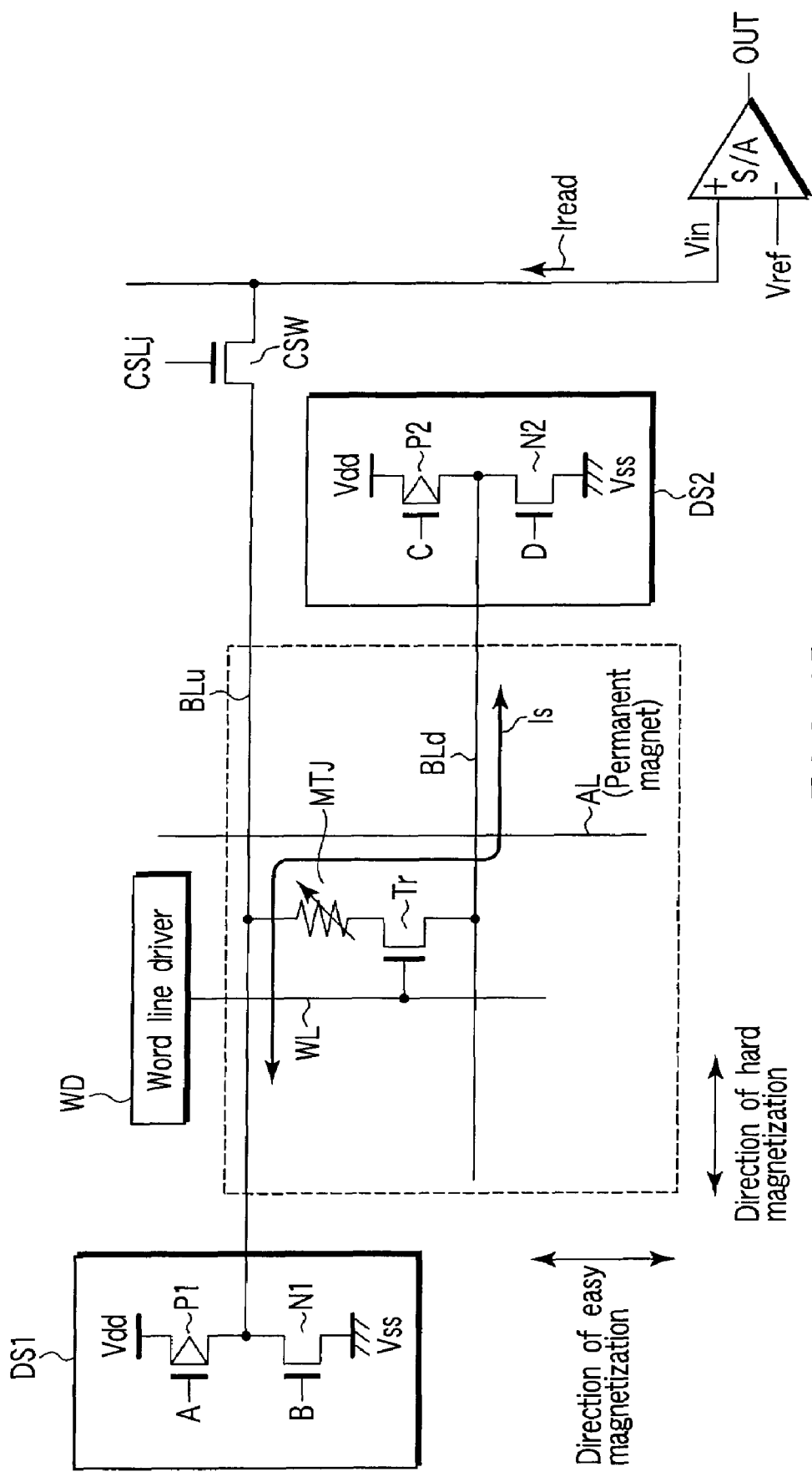
F I G. 15

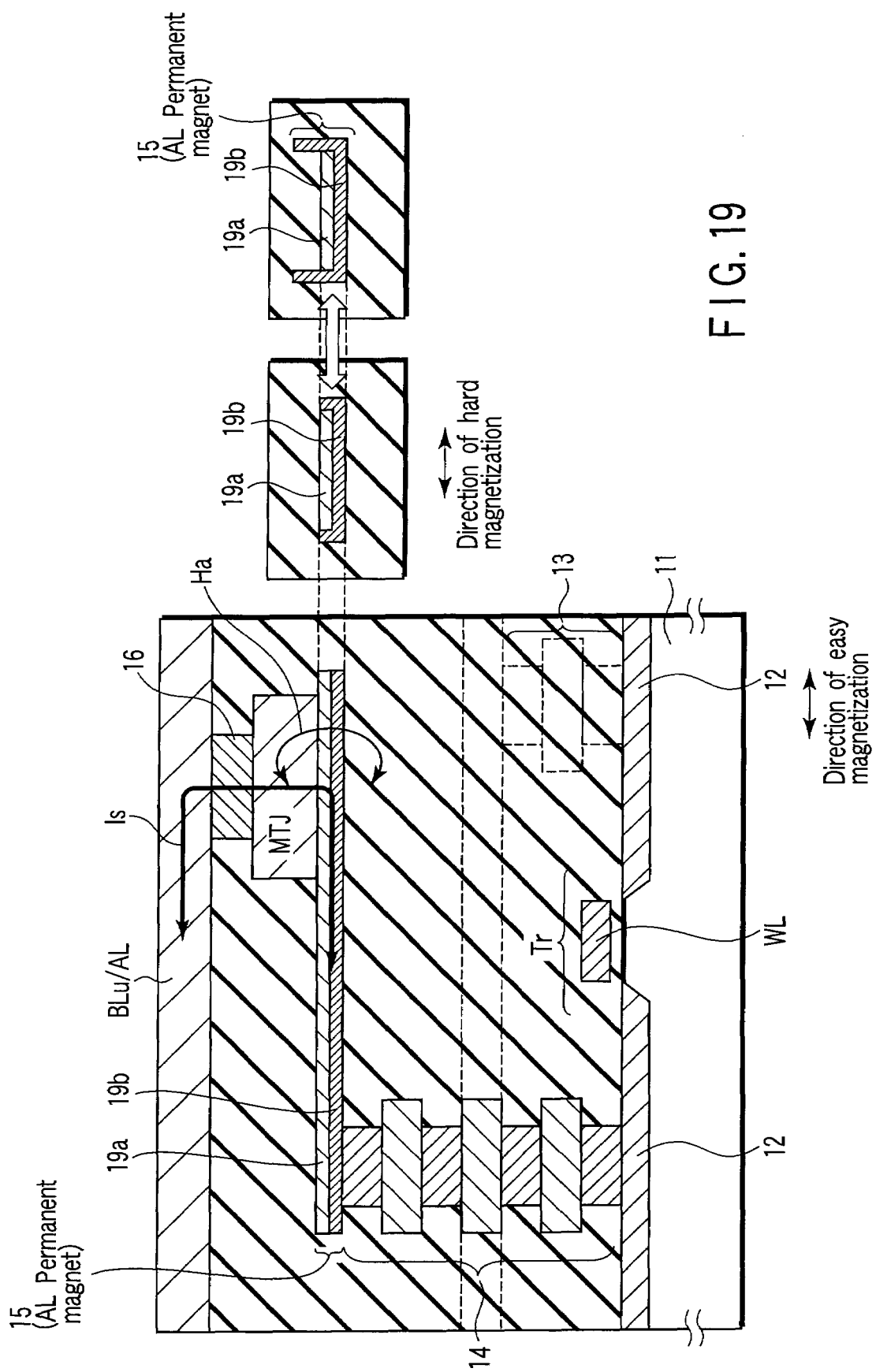
F I G. 19

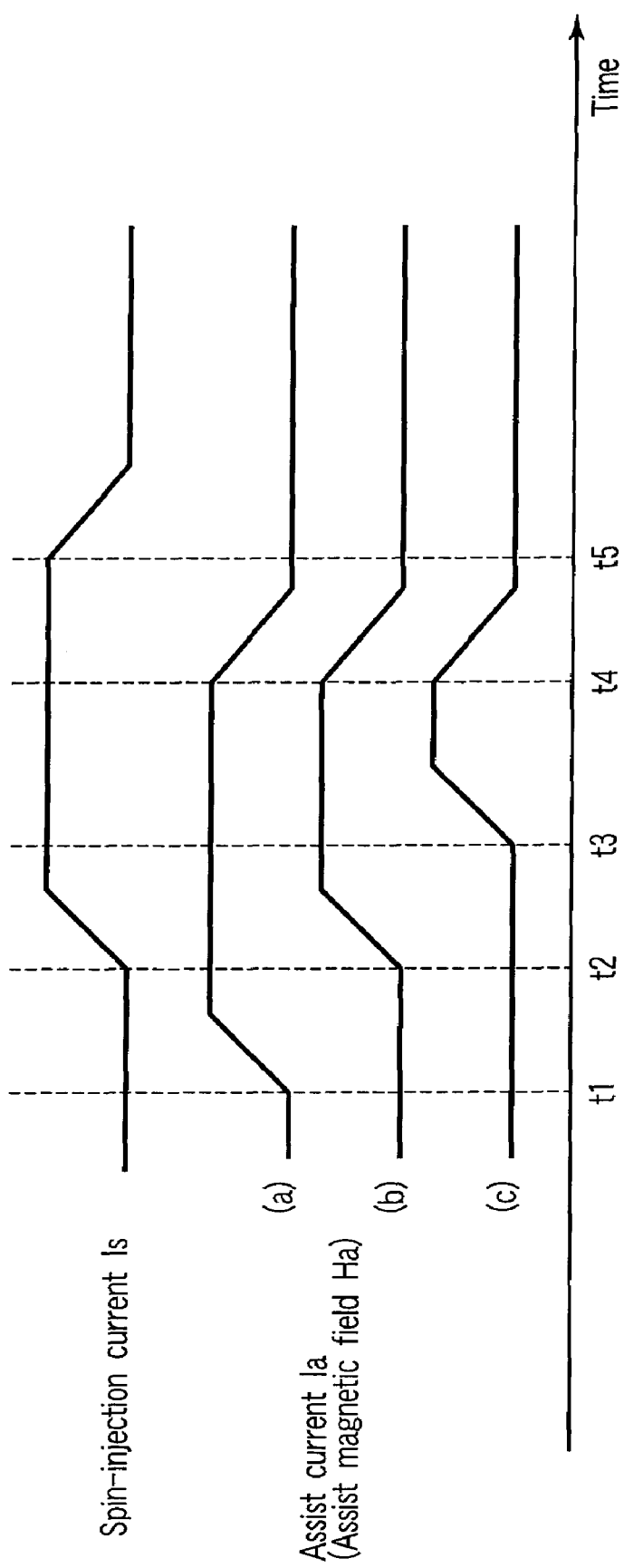
F I G. 22

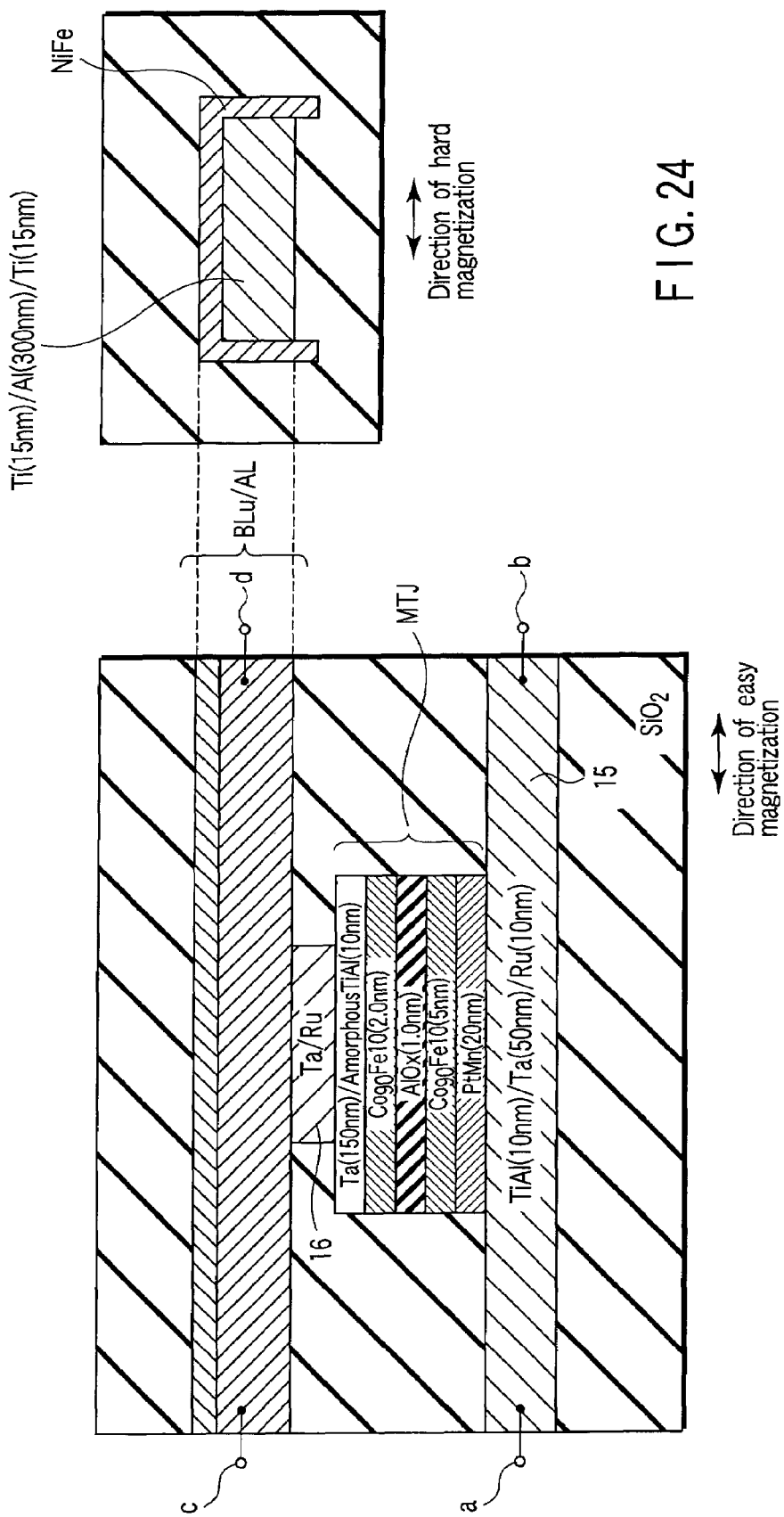
F I G. 24

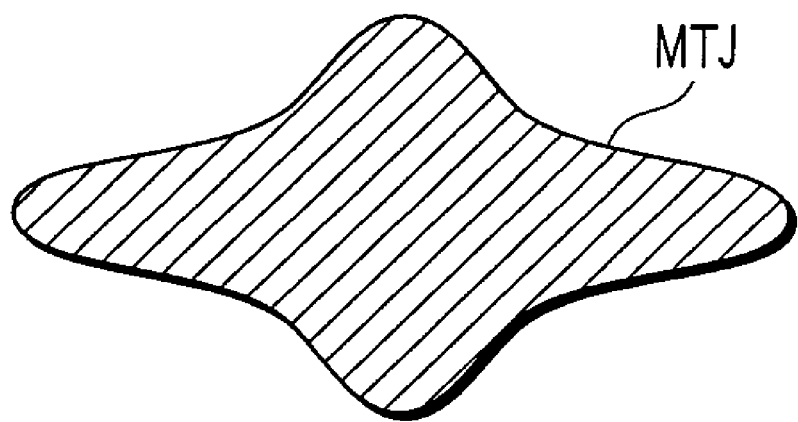
F I G. 28
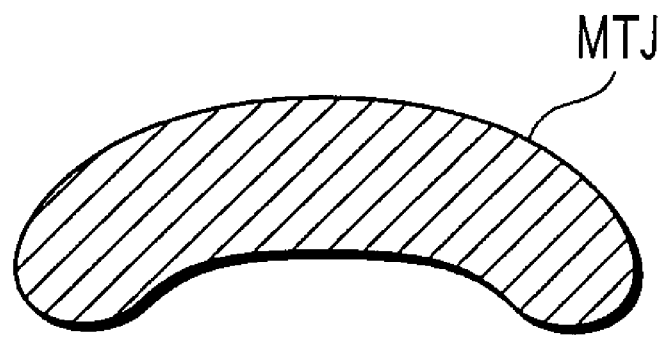
F I G. 29

SPIN-INJECTION MAGNETIC RANDOM ACCESS MEMORY

CROSS-REFERENCE TO RELATED APPLICATIONS

This application is a division of and claims the benefit of priority under 35 U.S.C. § 120 from U.S. application Ser. No. 11/373,303, filed Mar. 13, 2006, and claims the benefit of priority under 35 U.S.C. § 119 from Japanese Patent Application No. 2005-315459, filed Oct. 28, 2005. The entire contents of which are incorporated herein by reference.

BACKGROUND OF THE INVENTION

1. Field of the Invention

The present invention relates to a spin-injection magnetic random access memory which performs magnetization reversal by use of spin-polarized electrons.

2. Description of the Related Art

In recent years, intensive attempts have been made to apply a magnetoresistive element utilizing a tunneling magneto resistance (TMR) effect to a magnetic random access memory (MRAM).

In recent years, a magnetoresistive element has been obtained whose magnetoresistive (MR) ratio indicating a magnetoresistive change ratio is 230% or more, and dependence of the MR ratio on a voltage has been suppressed. This increases a possibility of putting the magnetic random access memory to practical use.

When the magnetoresistive element is used as a memory element of the magnetic random access memory, one of two ferromagnetic layers sandwiching a tunnel barrier layer therebetween is used as a magnetic pinned layer whose magnetization direction is pinned, and the other layer is used as a magnetic free layer whose magnetization direction changes.

A memory element using such a ferromagnetic single or double tunnel junction has characteristics that it is possible to store data in a nonvolatile manner, a write/read time is as fast as 10 ns or less, and the number of write times is $10^{15}$ times or more.

However, in a case where an architecture is adopted in which a memory cell is constituted of one transistor and one magnetoresistive element, there is a problem that a cell size cannot be reduced to be not more than that of a dynamic random access memory (DRAM).

To solve this problem, there are proposed a diode type architecture in which the magnetoresistive element and a diode are connected in series between a bit line and a word line, a simple matrix type architecture in which the only magnetoresistive element is disposed between the bit line and the word line and the like.

However, in any case, an only magnetic field (current magnetic field) generated by a current pulse is used during writing (magnetization reversal) with respect to a magnetic recording layer. This causes new problems that power consumption at a write time increases, a memory capacity cannot be enlarged owing to a limit of a tolerable current density of a wiring line, and an area of a driver/sinker which generates the current pulse enlarges.

Therefore, a structure is proposed in which a thin film constituted of a high-permeability magnetic material (yoke material) is formed around a write line as a path of the current pulse.

According to this structure, since the high-permeability magnetic material applies a magnetic field to the magnetoresistive element with a good efficiency, a current value required for the writing can be lowered. However, the value of the write current cannot be reduced to 1 mA or less.

As a technology to solve these problems at once, there is proposed a write method by means of a spin-injection magnetization reversal process (see, e.g., U.S. Pat. No. 6,256,223).

In this spin-injection magnetization reversal process, spin-polarized electrons (spin-injection currents) are injected into the magnetic recording layer of the memory element to thereby reverse the magnetization of the magnetic recording layer. Since the current value of the spin-injection current required for the writing decreases with miniaturization of the magnetic recording layer, there is much hope for the process as the write method with respect to the magnetic random access memory.

However, in this method, a value of about $8 \times 10^6$ A/cm$^2$ is required as the current density of the spin-injection current in order to perform the writing (magnetization reversal). Therefore, when the tunnel barrier layer is set to be thin with miniaturization of the magnetoresistive element, destruction of the layer comes into question (see, e.g., Yiming Huai et. al., Appl. Phys. Lett. 84 (2004) 3118 and 49th MMM conference ES-08, HA-05, and HA-12).

Therefore, the spin-injection currents need to be reduced in order to realize a stable write operation without causing such destruction.

Moreover, when the reduction of the spin-injection currents is realized in the spin-injection magnetization reversal process, the process can contribute to saving of the power consumption of the magnetic random access memory. In consequence, it is essential to reduce the spin-injection currents.

BRIEF SUMMARY OF THE INVENTION

A spin-injection magnetic random access memory of an aspect of the present invention includes: a magnetoresistive element, a unit which writes data into the magnetoresistive element by use of spin-polarized electrons generated by a spin-injection current and which applies, to the magnetoresistive element, a magnetic field of a direction of a hard magnetization of the magnetoresistive element during the writing.

A write method of an aspect of the present invention includes: applying a magnetic field to a magnetoresistive element in a direction of a hard magnetization of the magnetoresistive element while passing a spin-injection current through the magnetoresistive element to execute writing with respect to the magnetoresistive element.

BRIEF DESCRIPTION OF THE SEVERAL VIEWS OF THE DRAWING

FIG. 6 is a circuit diagram showing the first example of the magnetic random access memory of a second embodiment;

FIG. 7 is a circuit diagram showing a second example of the magnetic random access memory of the second embodiment;

FIG. 13 is a sectional view showing a third example of the device structure of the third embodiment;

FIG. 15 is a circuit diagram showing a magnetic random access memory of a fourth embodiment;

FIG. 19 is a sectional view showing a modification of the device structure of FIG. 13;

FIG. 22 is a diagram showing supply/cut-off timing of a spin-injection current and an assist current;

FIG. 24 is a sectional view showing a device structure of a second experimental example;

FIG. 28 is a diagram showing a plane shape of a magnetoresistive element of the fifth experimental example; and FIG. 29 is a diagram showing a plane shape of the magnetoresistive element of the fifth experimental example.

DETAILED DESCRIPTION OF THE INVENTION

A spin-injection magnetic random access memory of an aspect of the present invention will be described below in detail with reference to the accompanying drawing.

1. Outline

In the example of the present invention, during writing by a spin-injection magnetization reversal method, a spin-injection current is passed through a magnetoresistive element, and there is generated an assist magnetic field to assist magnetization reversal of a magnetic recording layer to thereby perform the magnetization reversal of the magnetic recording layer with a small spin-injection current.

Figure 1:
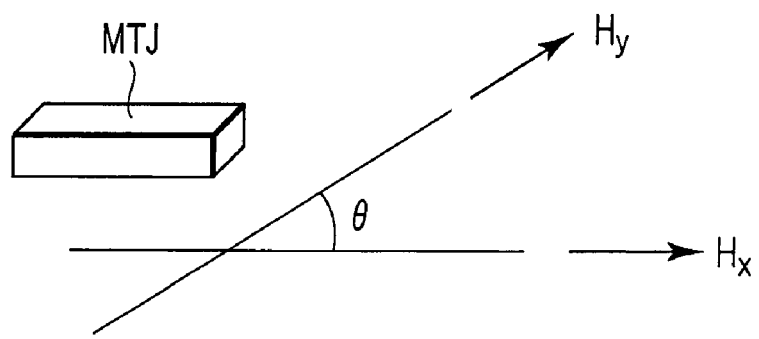
FIG. 1 is an explanatory view of a principle of an example of the present invention.
Figure 2:
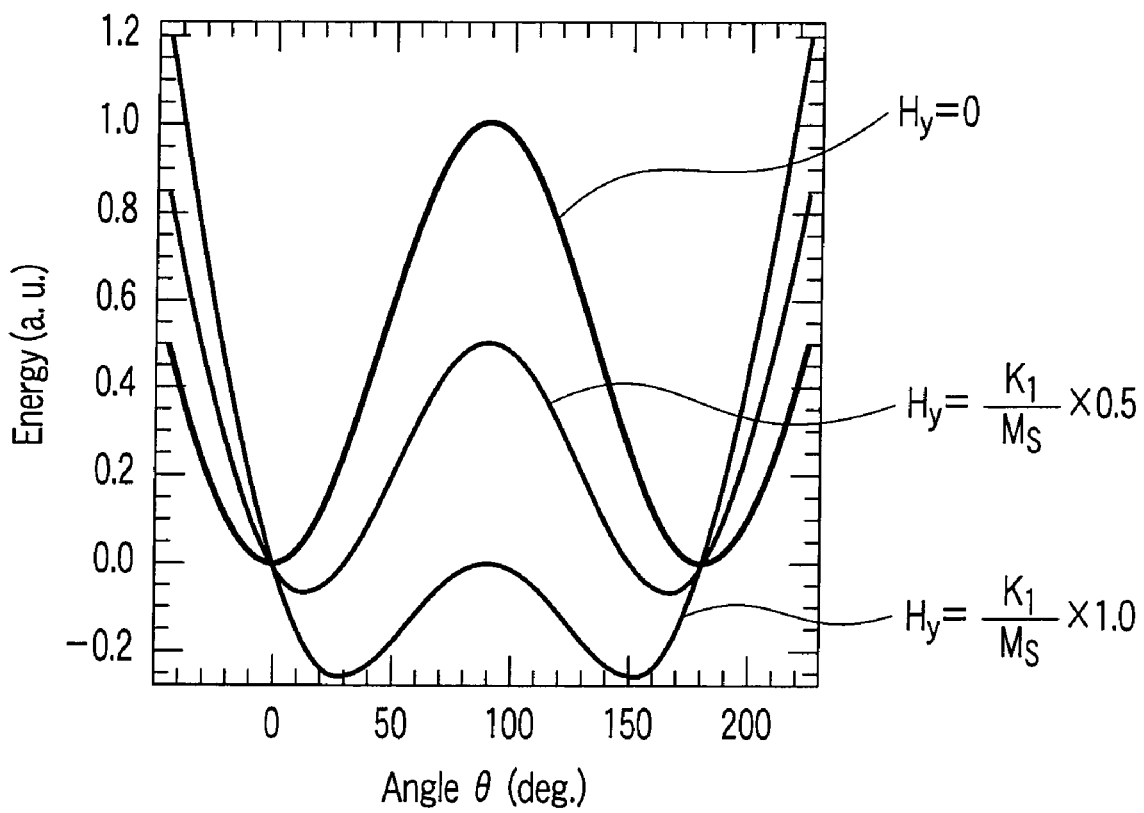
FIG. 2 is an explanatory view of a principle of an example of the present invention.

The assist magnetic field is applied to the magnetoresistive element in a direction of a hard magnetization. The assist magnetic field is applied to the magnetoresistive element in the direction of the hard magnetization for the following reason:

FIGS. 1 and 2 each shows an energy required for the magnetization reversal of the magnetic recording layer at a time when a magnetic field Hx of a direction of an easy magnetization and a magnetic field Hy of a direction of a hard magnetization are applied to a magnetoresistive element MTJ.

Accordingly, it is found that the energy is the highest when the magnetic field Hy of the direction of the hard magnetization is 0 and that the energy is gradually reduced when a value of the magnetic field Hy of the direction of the hard magnetization increases.

Therefore, the magnetization direction of the magnetic recording layer is reversed even in the spin-injection magnetization reversal method. When the spin-injection current is passed, and the magnetic field Hy of the direction of the hard magnetization is generated during the writing, the magnetization reversal can be performed with the spin-injection current which is smaller than before.

As described above, in the example of the present invention, when the assist magnetic field of the direction of the hard magnetization of the magnetic recording layer is generated during the writing by the spin-injection magnetization reversal method, it is possible to reduce the spin-injection current.

2. Embodiment

Next, there will be described several embodiments supposed to be the best.

(1) First Embodiment

A first embodiment is an example in which a path of a spin-injection current is completely separated from that of an assist current.

A. Circuit Diagram

Figure 3:
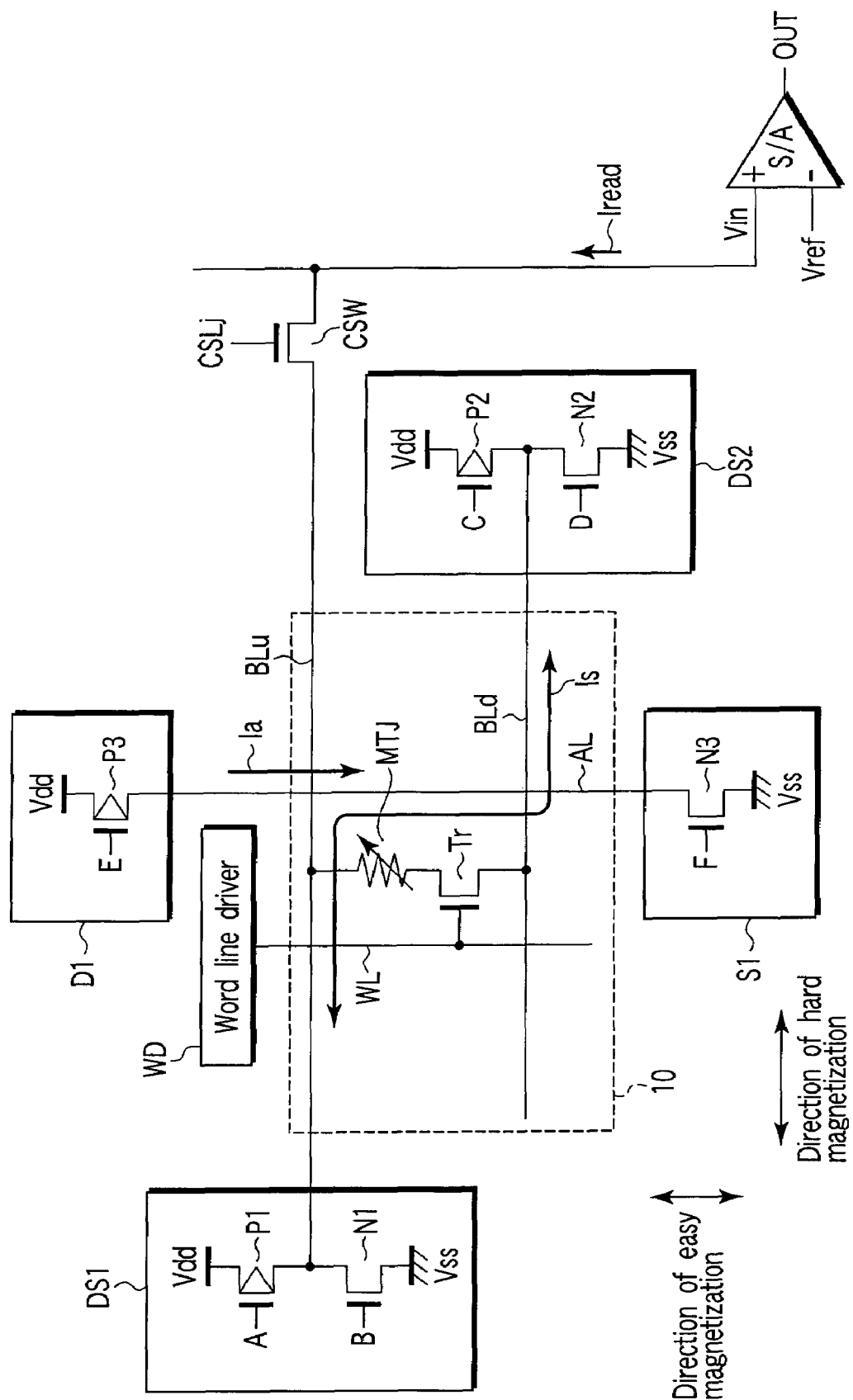
FIG. 3 is a circuit diagram showing a magnetic random access memory of a first embodiment.

FIG. 3 is a circuit diagram showing a main part of a magnetic random access memory in a first embodiment.

A magnetoresistive element MTJ constitutes a part of a memory cell array 10.

One end of the magnetoresistive element MTJ is connected to an upper bit line BLu, and the other end thereof is connected to a lower bit line BLd via an N-channel MOS transistor Tr as a selection switch. Both of the upper bit line BLu and the lower bit line BLd extend in the same direction which is a direction of a hard magnetization (column direction) of the magnetoresistive element MTJ in the present example.

One end of the upper bit line BLu is connected to a CMOS type driver/sinker DS1. The driver/sinker DS1 is constituted of a P-channel MOS transistor P1 and an N-channel MOS transistor N1 connected in series between power supply terminals Vdd and Vss.

The other end of the upper bit line BLu is connected to a sense amplifier S/A via an N-channel MOS transistor CSW as a selection switch.

One end of the lower bit line BLd is connected to a CMOS type driver/sinker DS2. The driver/sinker DS2 is constituted of a P-channel MOS transistor P2 and an N-channel MOS transistor N2 connected in series between power supply terminals Vdd and Vss.

A gate of the N-channel MOS transistor Tr is connected to a word line WL. The word line WL extends in a direction of an easy magnetization (row direction) of the magnetoresistive element MTJ, and one end of the word line is connected to a word line driver WD.

Moreover, a write assist line AL extending in the direction of the easy magnetization is disposed in the vicinity of the magnetoresistive element MTJ.

One end of the write assist line AL is connected to a driver D1 constituted of a P-channel MOS transistor P3, and the other end of the line is connected to a sinker S1 constituted of an N-channel MOS transistor N3.

B. Operation

An operation of the magnetic random access memory of FIG. 3 will be described.

In a write operation, a level of the word line WL is set to be "high (H)" by the word line driver WD, and the N-channel MOS transistor Tr is turned on.

When "1" is written into the magnetoresistive element MTJ, levels of control signals A and B are set to be "low (L)", and levels of control signals C and D are set to "H". In this case, since the P-channel MOS transistor P1 and the N-channel MOS transistor N2 turn on, a spin-injection current Is flows through the magnetoresistive element MTJ in a direction from the driver/sinker DS1 to the driver/sinker DS2.

In parallel with this, the level of a control signal E is set to "L", the level of a control signal F is set to "H", and an assist current Ia is passed through the write assist line AL from the driver D1 to the sinker S1. This assist current Ia generates an assist magnetic field in the direction of the hard magnetization of the magnetoresistive element MTJ.

When "0" is written into the magnetoresistive element MTJ, the levels of the control signals A and B are set to "H", and the levels of the control signals C and D are set to "L". In this case, since the P-channel MOS transistor P2 and the N-channel MOS transistor N1 turn on, the spin-injection current Is flows through the magnetoresistive element MTJ in a direction from the driver/sinker DS2 to the driver/sinker DS1.

In parallel with this, the level of the control signal E is set to "L", the level of the control signal F is set to "H", and the assist current Ia directed from the driver D1 toward the sinker S1 is passed through the write assist line AL. This assist current Ia generates the assist magnetic field in the direction of the hard magnetization of the magnetoresistive element MTJ.

Here, in the present example, since the direction of the assist magnetic field does not have to be changed depending on the value of the write data, the direction of the assist current Ia may be constant. As a result, areas required for the driver D1 and the sinker S1 can be reduced.

It is to be noted that the levels of the control signals A, B, C, and D may be set to "L" to pre-charge the upper bit line BLu and the lower bit line BLd before passing the spin-injection current Is to write the data.

Similarly, the control signals E and F may be set to "L" to pre-charge the write assist line AL before passing the assist current Ia.

Moreover, after cutting off the spin-injection current Is to complete the writing, the levels of the control signals A, B, C, and D may be set to "H" to fix the upper and lower bit lines BLu and BLd to a ground potential Vss.

Similarly, after cutting off the assist current Ia, the levels of the control signals E and F may be set to "H" to fix the write assist line AL to the ground potential Vss.

A relation between supply/cut-off timings of the spin-injection current Is and the assist current Ia will be described in paragraphs of a magnetization reversal process.

In a read operation, the level of the word line WL is set to "H" via the word line driver WD, and the N-channel MOS transistor Tr is turned on. A selection signal CSLj is set to "H", and the N-channel MOS transistor CSW is turned on.

The levels of the control signals A, C, and D are set to "H", and the level of the control signal B is set to "L" to form a current path from the sense amplifier S/A to the ground point Vss via the magnetoresistive element MTJ.

Moreover, when a read current Iread is supplied from the sense amplifier S/A to the magnetoresistive element MTJ, for example, an input potential Vin of the sense amplifier S/A changes depending on data (resistance value) stored in the magnetoresistive element MTJ. Therefore, this potential is compared with a reference potential Vref to detect a data value.

It is to be noted that a value of the read current Iread is set to be smaller than that of the spin-injection current Is in order to avoid disturbance during the reading.

C. Device Structure

An example of a device structure of a memory cell will be described.

Figure 4:
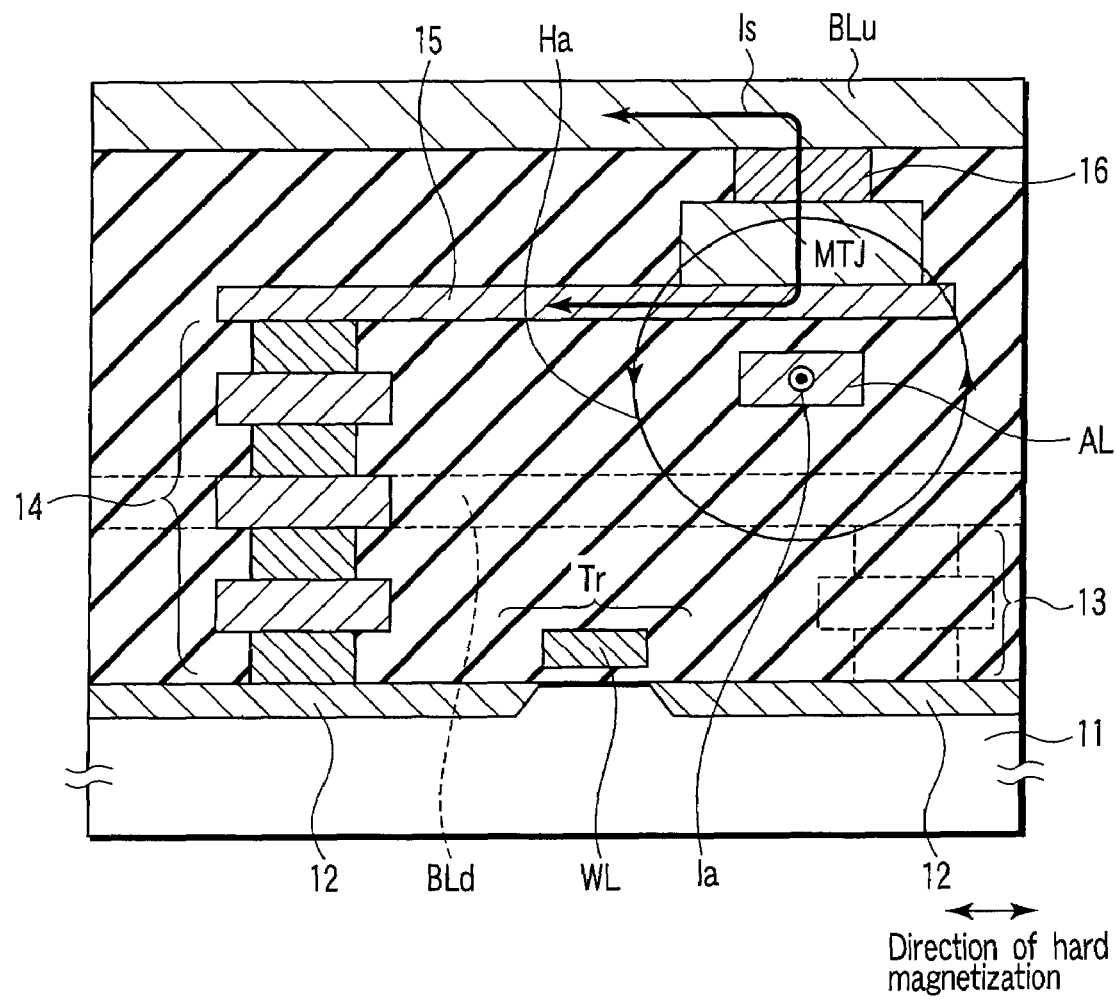
FIG. 4 is a sectional view showing a first example of a device structure of the first embodiment.

FIG. 4 shows a first example of the device structure.

This structure is a 1Tr-1MTJ structure in which the memory cell is constituted of one transistor and one magnetoresistive element.

The N-channel MOS transistor Tr is disposed as the selection switch in a surface area of a semiconductor substrate 11. The N-channel MOS transistor Tr is constituted of source/drain diffusion layers 12, and a gate electrode (word line) WL disposed above a channel between these layers.

One of the source/drain diffusion layers 12 is connected to the lower bit line BLd via an intermediate layer 13. The other source/drain diffusion layer 12 is connected to a lower electrode 15 via an intermediate layer 14.

The magnetoresistive element MTJ is disposed on the lower electrode 15.

There is not any special restriction on a shape, a structure or the like of the magnetoresistive element MTJ, but the magnetoresistive element MTJ preferably has one-direction anisotropy as a magnetic pinned layer, and a one-axis anisotropy as a magnetic recording layer.

The whole thickness of the magnetoresistive element MTJ is preferably set to a value in a range of 0.1 nm to 100 nm.

A ferromagnetic layer (magnetic pinned layer, magnetic recording layer or the like) constituting the magnetoresistive element MTJ needs to be prevented from being super-paramagnetic. To this end, the thickness of the layer is preferably set to a value of 0.4 nm or more.

The write assist line AL is disposed under the magnetoresistive element MTJ. In the write assist line AL, the assist current Ia flows, for example, from the back of a drawing sheet toward the front. Accordingly, an assist magnetic field Ha directed leftwards in the drawing is applied to the magnetoresistive element MTJ.

The upper bit line BLu is disposed on the magnetoresistive element MTJ via a contact layer 16. The spin-injection current Is flows through the magnetoresistive element MTJ in a direction from the lower bit line BLd toward the upper bit line BLu or from the upper bit line BLu toward the lower bit line BLd.

In such structure, when an intermediate layer made of an amorphous metal, a micro crystal metal or the like is disposed between the magnetoresistive element MTJ and the contact layer 16 or the lower electrode 15, a value of a switching magnetic field (reverse magnetic field) can further be reduced.

Figure 5:
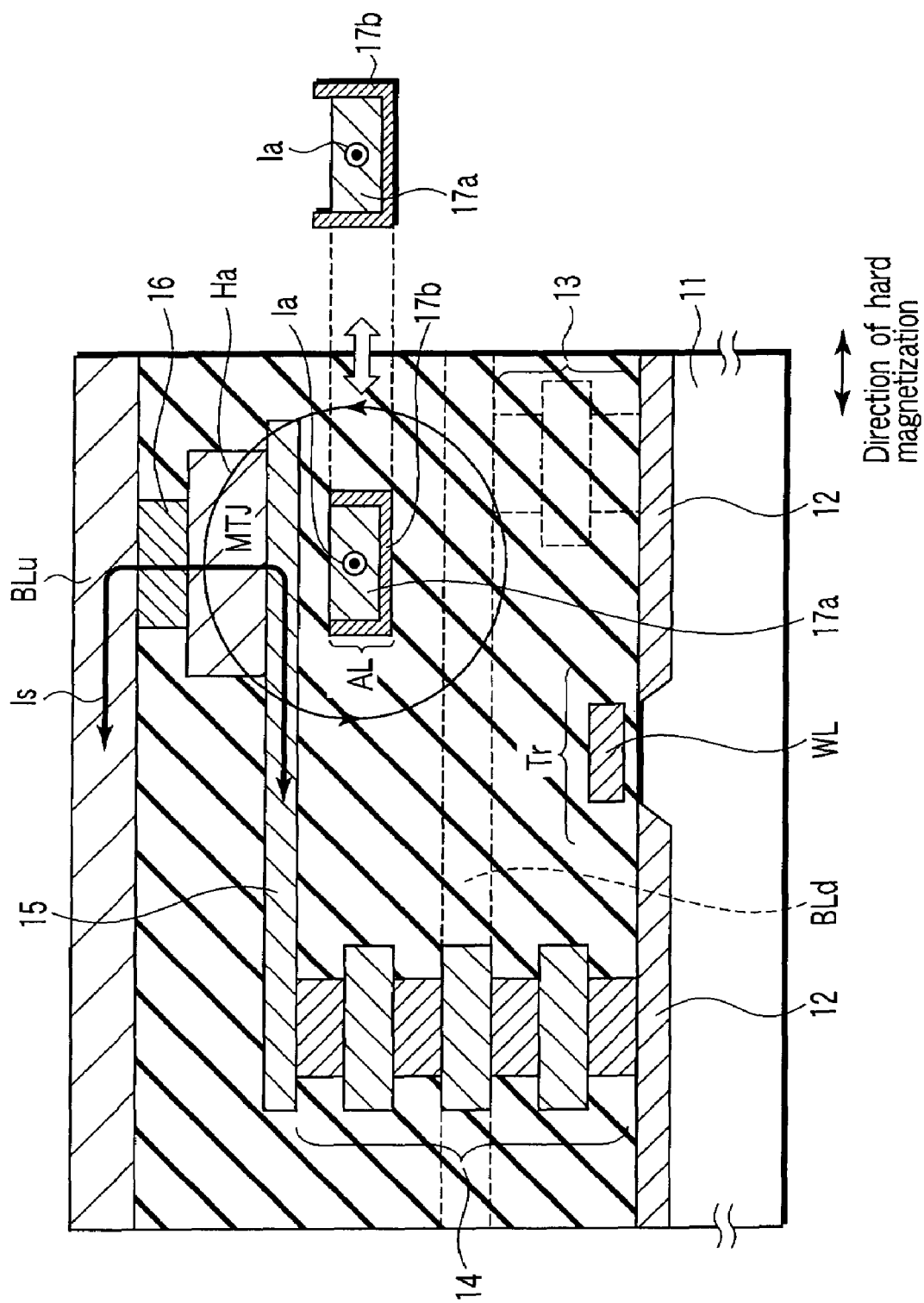
FIG. 5 is a sectional view showing a second example of the device structure of the first embodiment.

FIG. 5 shows a second example of the device structure.

A characteristic of the second example is different from that of the first example in that the write assist line AL has a so-called yoke structure. The other respects are the same as those of the first example.

The write assist line AL is constituted of a main body 17a made of a conductive material such as a metal or an alloy, and a high-permeability magnetic material (yoke material) 17b disposed on an undersurface and sides of the main body 17a.

The high-permeability magnetic material 17b may be of such a horned type as to protrude upwards from the top of the main body 17a.

In the first and second examples, there has been described the 1Tr-1MTJ structure in which the memory cell is constituted of one transistor and one magnetoresistive element, but the examples of the present invention are applicable to another structure such as a three-dimensional structure in which the magnetoresistive elements MTJ are stacked.

D. Conclusions

According to the first embodiment, during the writing by the spin-injection magnetization reversal method, the magnetization reversal can be assisted using the assist magnetic field of the direction of the hard magnetization to realize the reduction of the spin-injection currents.

(2) Second Embodiment

A second embodiment is an example in which a path of a spin-injection current partially agrees with that of an assist current.

A. Circuit Diagram

FIG. 6 is a circuit diagram showing a first example of a main part of a magnetic random access memory in a second embodiment.

A magnetoresistive element MTJ constitutes a part of a memory cell array 10.

One end of the magnetoresistive element MTJ is connected to an upper bit line BLu/write assist line AL, and the other end thereof is connected to a lower bit line BLd via an N-channel MOS transistor Tr as a selection switch.

Both of the upper bit line BLu/write assist line AL and the lower bit line BLd extend in the same direction which is a direction of an easy magnetization (column direction) of the magnetoresistive element MTJ in the present example.

One end of the upper bit line BLu/write assist line AL is connected to CMOS type drivers/sinkers DS1 and DS3.

The driver/sinker DS1 is constituted of a P-channel MOS transistor P1 and an N-channel MOS transistor N1 connected in series between power supply terminals Vdd and Vss, and the driver/sinker DS3 is constituted of a P-channel MOS transistor P4 and an N-channel MOS transistor N4 connected in series between power supply terminals Vdd and Vss.

The other end of the upper bit line BLu/write assist line AL is connected to a CMOS type driver/sinker DS4. The driver/sinker DS4 is constituted of a P-channel MOS transistor P5 and an N-channel MOS transistor N5 connected in series between power supply terminals Vdd and Vss.

Moreover, the other end of the upper bit line BLu/write assist line AL is connected to a sense amplifier S/A via an N-channel MOS transistor CSW as a selection switch.

One end of the lower bit line BLd is connected to a CMOS type driver/sinker DS2. The driver/sinker DS2 is constituted of a P-channel MOS transistor P2 and an N-channel MOS transistor N2 connected in series between power supply terminals Vdd and Vss.

A gate of the N-channel MOS transistor Tr is connected to a word line WL. The word line WL extends in a direction of a hard magnetization (row direction) of the magnetoresistive element MTJ, and one end of the word line is connected to a word line driver WD.

FIG. 7 is a circuit diagram showing a second example of a main part of a magnetic random access memory in the second embodiment.

A magnetoresistive element MTJ constitutes a part of a memory cell array 10.

One end of the magnetoresistive element MTJ is connected to an upper bit line BLu/write assist line AL, and the other end thereof is connected to a lower bit line BLd via an N-channel MOS transistor Tr as a selection switch.

Both of the upper bit line BLu/write assist line AL and the lower bit line BLd extend in the same direction which is a direction of an easy magnetization (column direction) of the magnetoresistive element MTJ in the present example.

One end of the upper bit line BLu/write assist line AL is connected to a driver D2. The driver D2 is constituted of P-channel MOS transistors P6 and P7 connected in parallel between power supply terminals Vdd and the upper bit line BLu/write assist line AL.

The other end of the upper bit line BLu/write assist line AL is connected to a sinker S2. The sinker S2 is constituted of N-channel MOS transistors N6 and N7 connected in parallel between the upper bit line BLu/write assist line AL and power supply terminals Vss.

Moreover, the other end of the upper bit line BLu/write assist line AL is connected to a sense amplifier S/A via an N-channel MOS transistor CSW as a selection switch.

One end of the lower bit line BLd is connected to a CMOS type driver/sinker DS2. The driver/sinker DS2 is constituted of a P-channel MOS transistor P2 and an N-channel MOS transistor N2 connected in series between power supply terminals Vdd and Vss.

A gate of the N-channel MOS transistor Tr is connected to a word line WL. The word line WL extends in a direction of a hard magnetization (row direction) of the magnetoresistive element MTJ, and one end of the word line is connected to a word line driver WD.

Since the upper bit line BLu also functions as the write assist line AL in the second embodiment, the number of conductive lines can be reduced as many as the write assist lines AL as compared with the first embodiment.

B. Operation

An operation of the magnetic random access memory of FIG. 6 will be described.

In a write operation, a level of the word line WL is set to "H" by the word line driver WD, and the N-channel MOS transistor Tr is turned on.

When "1" is written into the magnetoresistive element MTJ, levels of control signals A and B are set to "L", and levels of control signals C and D are set to "H". In this case, since the P-channel MOS transistor P1 and the N-channel MOS transistor N2 turn on, a spin-injection current Is flows through the magnetoresistive element MTJ in a direction from the driver/sinker DS1 to the driver/sinker DS2.

In parallel with this, the levels of control signals G and H are set to "L", and the levels of control signals I and J are set to "H" to pass, through the upper bit line BLu/write assist line AL, an assist current Ia directed from the driver/sinker DS3 toward the driver/sinker DS4. This assist current Ia generates an assist magnetic field of the direction of the hard magnetization of the magnetoresistive element MTJ.

When "0" is written into the magnetoresistive element MTJ, the levels of the control signals A and B are set to "H", and the levels of the control signals C and D are set to "L". In this case, since the P-channel MOS transistor P2 and the N-channel MOS transistor N1 turn on, the spin-injection current Is flows through the magnetoresistive element MTJ in a direction from the driver/sinker DS2 toward the driver/sinker DS1.

In parallel with this, the levels of the control signals G and H are set to "H", and the levels of the control signals I and J are set to "L" to pass, through the upper bit line BLu/write assist line AL, the assist current Ia directed from the driver/sinker DS4 toward the driver/sinker DS3. This assist current Ia generates the assist magnetic field of the direction of the hard magnetization of the magnetoresistive element MTJ.

Here, in the present example, in order to change the direction of the assist magnetic field depending on a value of write data, the drivers/sinkers DS3 and DS4 for generating the assist current Ia are disposed on opposite ends of the upper bit line BLu/write assist line AL.

The value of the assist current Ia may be equal to or different from that of the spin-injection current Is.

It is to be noted that the levels of the control signals A, B, C, D, E, F, G, and H may be set to "L" to pre-charge the upper bit line BLu/write assist line AL and the lower bit line BLd before passing the spin-injection current Is to write the data.

Moreover, after cutting off the spin-injection current Is to complete the writing, the levels of the control signals A, B, C, D, E, F, G, and H may be set to "H" to fix the upper bit line BLu/write assist line AL and the lower bit line BLd to a ground potential Vss.

A relation between supply/cut-off timings of the spin-injection current Is and the assist current Ia will be described in paragraphs of a magnetization reversal process.

In a read operation, the level of the word line WL is set to "H" via the word line driver WD, and the N-channel MOS transistor Tr is turned on. A selection signal CSLj is set to "H", and the N-channel MOS transistor CSW is turned on.

The levels of the control signals A, C, D, G, and I are set to "H", and the levels of the control signals B, H, and J are set to "L" to form a current path from the sense amplifier S/A to the ground point Vss via the magnetoresistive element MTJ.

Moreover, when a read current Iread is supplied from the sense amplifier S/A to the magnetoresistive element MTJ, for example, an input potential Vin of the sense amplifier S/A changes depending on data (resistance value) stored in the magnetoresistive element MTJ. Therefore, this potential is compared with a reference potential Vref to detect a data value.

An operation of the magnetic random access memory of FIG. 7 will be described.

In a write operation, a level of the word line WL is set to "H" by the word line driver WD, and the N-channel MOS transistor Tr is turned on.

When "1" is written into the magnetoresistive element MTJ, levels of control signals K and M are set to "L", and levels of control signals C and D are set to "H". In this case, since the P-channel MOS transistor P6 and the N-channel MOS transistor N2 turn on, a spin-injection current Is flows through the magnetoresistive element MTJ in a direction from the driver DS2 to the driver/sinker DS2.

In parallel with this, the level of a control signal L is set to "L", and the level of a control signal N is set to "H" to pass, through the upper bit line BLu/write assist line AL, an assist current Ia directed from the driver D2 toward the sinker S2. This assist current Ia generates an assist magnetic field of the direction of the hard magnetization of the magnetoresistive element MTJ.

When "0" is written into the magnetoresistive element MTJ, the levels of the control signals K and M are set to "H", and the levels of the control signals C and D are set to "L". In this case, since the P-channel MOS transistor P2 and the N-channel MOS transistor N6 turn on, the spin-injection current Is flows through the magnetoresistive element MTJ in a direction from the driver/sinker DS2 toward the sinker S2.

In parallel with this, the level of the control signal L is set to "L", and the level of the control signal N is set to "H" to pass, through the upper bit line BLu/write assist line AL, the assist current Ia directed from the driver D2 toward the sinker S2. This assist current Ia generates the assist magnetic field of the direction of the hard magnetization of the magnetoresistive element MTJ.

Here, in the present example, the direction of the assist magnetic field does not have to be changed depending on the value of the write data. Therefore, the direction of the assist current Ia may be constant. As a result, areas required for the driver D2 and the sinker S2 can be reduced.

The value of the assist current Ia may be equal to or different from that of the spin-injection current Is.

It is to be noted that the levels of the control signals C, D, K, L, M, and N may be set to "L" to pre-charge the upper bit line BLu/write assist line AL and the lower bit line BLd before passing the spin-injection current Is to write the data.

Moreover, after cutting off the spin-injection current Is to complete the writing, the levels of the control signals C, D, K, L, M, and N may be set to "H" to fix the upper bit line BLu/write assist line AL and the lower bit line BLd to a ground potential Vss.

A relation between supply/cut-off timings of the spin-injection current Is and the assist current Ia will be described in paragraphs of a magnetization reversal process.

In a read operation, the level of the word line WL is set to "H" via the word line driver WD, and the N-channel MOS transistor Tr is turned on. A selection signal CSLj is set to "H", and the N-channel MOS transistor CSW is turned on.

The levels of the control signals C, D, K, and L are set to "H", and the levels of the control signals M and N are set to "L" to form a current path from the sense amplifier S/A to the ground point Vss via the magnetoresistive element MTJ.

Moreover, when a read current Iread is supplied from the sense amplifier S/A to the magnetoresistive element MTJ, for example, an input potential Vin of the sense amplifier S/A changes depending on data (resistance value) stored in the magnetoresistive element MTJ. Therefore, this potential is compared with a reference potential Vref to detect a data value.

It is to be noted that the value of the read current Iread is set to be smaller than that of the spin-injection current Is in order to avoid disturbance during the reading.

C. Device Structure

An example of a device structure of a memory cell will be described.

Figure 8:
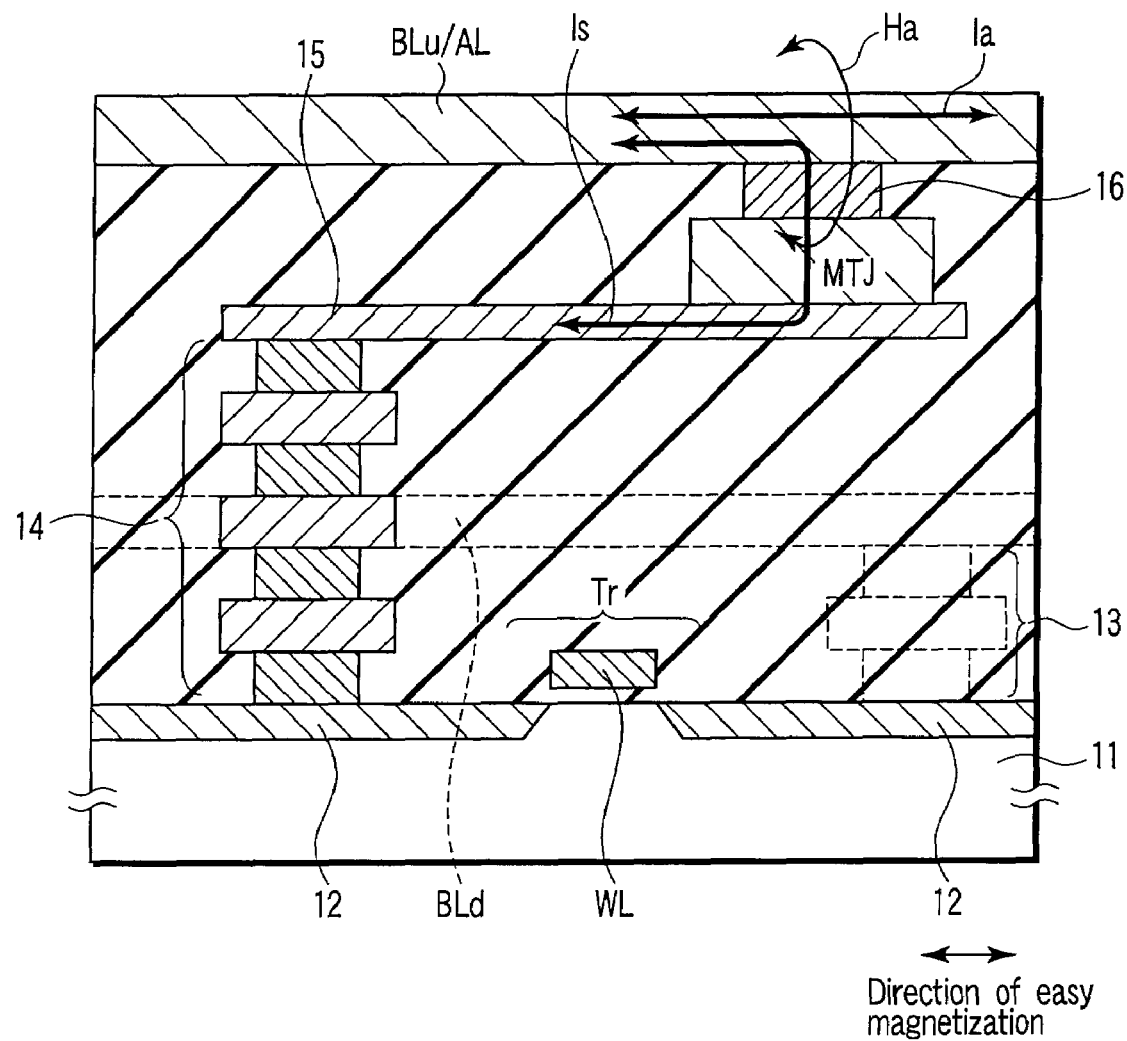
FIG. 8 is a sectional view showing a first example of the device structure of the second embodiment.

FIG. 8 shows a first example of the device structure.

This structure is a 1Tr-1MTJ structure in which the memory cell is constituted of one transistor and one magnetoresistive element.

The N-channel MOS transistor Tr is disposed as the selection switch in a surface area of a semiconductor substrate 11. The N-channel MOS transistor Tr is constituted of source/drain diffusion layers 12, and a gate electrode (word line) WL disposed above a channel between these layers.

One of the source/drain diffusion layers 12 is connected to the lower bit line BLd via an intermediate layer 13. The other source/drain diffusion layer 12 is connected to a lower electrode 15 via an intermediate layer 14.

The magnetoresistive element MTJ is disposed on the lower electrode 15.

There is not any special restriction on a shape, a structure or the like of the magnetoresistive element MTJ, but the magnetoresistive element MTJ preferably has one-direction anisotropy as a magnetic pinned layer, and a one-axis anisotropy as a magnetic recording layer.

The whole thickness of the magnetoresistive element MTJ is preferably set to a value in a range of 0.1 nm to 100 nm.

A ferromagnetic layer (magnetic pinned layer, magnetic recording layer or the like) constituting the magnetoresistive element MTJ needs to be prevented from being super-paramagnetic. To this end, the thickness of the layer is preferably set to a value of 0.4 nm or more.

The upper bit line BLu/write assist line AL is disposed on the magnetoresistive element MTJ via a contact layer 16. In the magnetoresistive element MTJ, the spin-injection current Is flows in a direction from the lower bit line BLd toward the upper bit line BLu/write assist line AL or from the upper bit line BLu/write assist line AL toward the lower bit line BLd.

Moreover, in the upper bit line BLu/write assist line AL, the assist current Ia flows, for example, leftwards or rightwards in the drawing. Accordingly, an assist magnetic field Ha is applied to the magnetoresistive element MTJ in a direction crossing the drawing perpendicularly.

In such structure, when an intermediate layer made of an amorphous metal, a micro crystal metal or the like is disposed between the magnetoresistive element MTJ and the contact layer 16 or the lower electrode 15, a value of a switching magnetic field (reverse magnetic field) can further be reduced.

Figure 9:
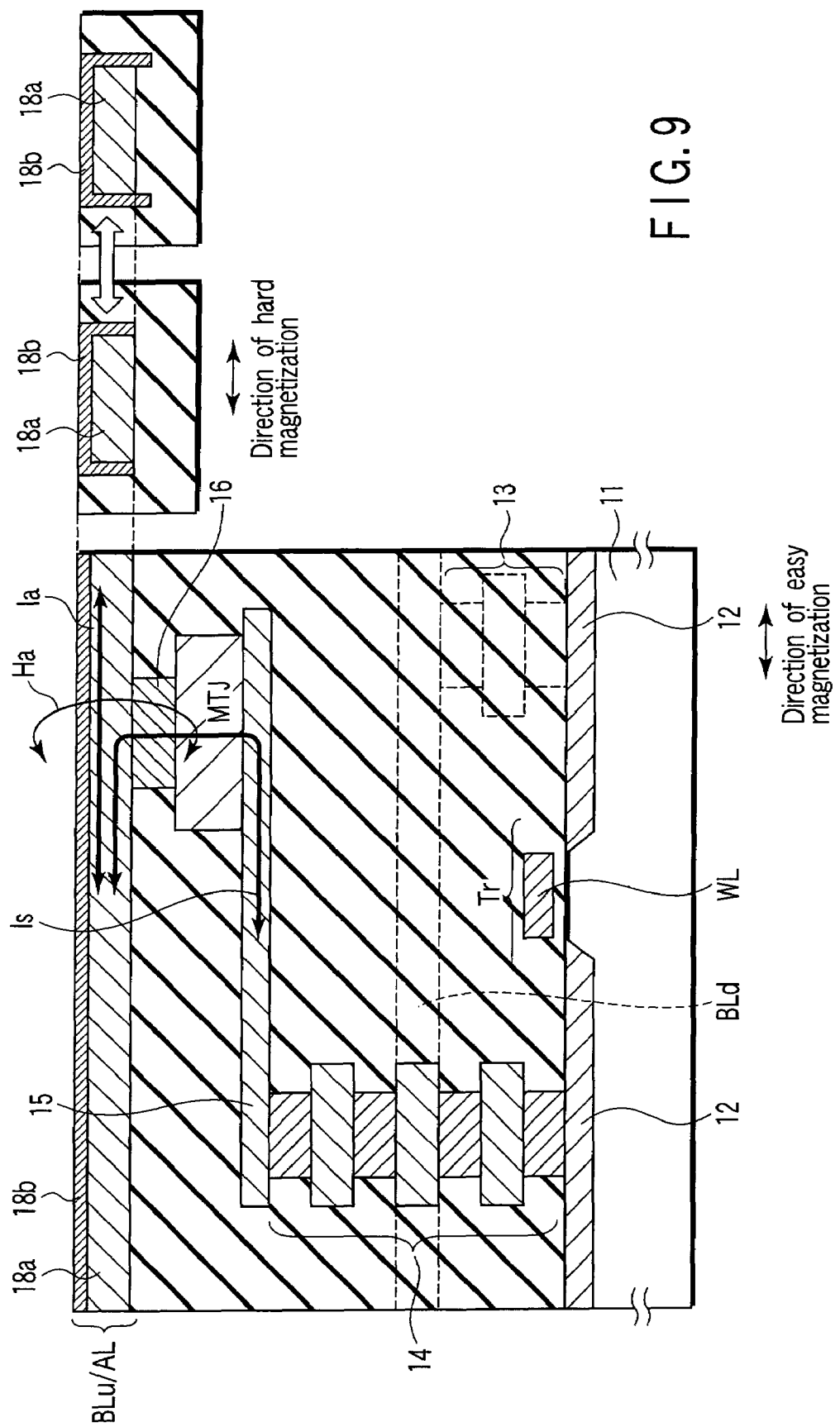
FIG. 9 is a sectional view showing a second example of the device structure of the second embodiment.

FIG. 9 shows a second example of the device structure.

A characteristic of the second example is different from that of the first example in that the upper bit line BLu/write assist line AL has a so-called yoke structure. The other respects are the same as those of the first example.

The upper bit line BLu/write assist line AL is constituted of a main body 18a made of a conductive material such as a metal or an alloy, and a high-permeability magnetic material (yoke material) 18b disposed on the top and sides of the main body 18a. The high-permeability magnetic material 18b may be of such a horned type as to protrude downwards from the underside of the main body 18a.

In the first and second examples, there has been described the 1Tr-1MTJ structure in which the memory cell is constituted of one transistor and one magnetoresistive element, but the examples of the present invention are applicable to another structure such as a three-dimensional structure in which the magnetoresistive elements MTJ are stacked.

D. Conclusions

According to the second embodiment, an effect of the reduction of the spin-injection current can be realized in the same manner as in the first embodiment. In addition, since the upper bit line BLu also functions as the write assist line AL, the number of conductive lines in the memory cell array can be reduced, and costs can be reduced.

(3) Third Embodiment

A third embodiment is an example in which a path of a spin-injection current completely agrees with that of an assist current.

In the third embodiment, there are supposed two cases: a case where the spin-injection current itself also functions as the assist current; and a case where an operation of the spin-injection current is distinguished from that of the assist current. There will be described hereinafter a case where the former spin-injection current generates an assist magnetic field.

A. Circuit Diagram

Figure 10:
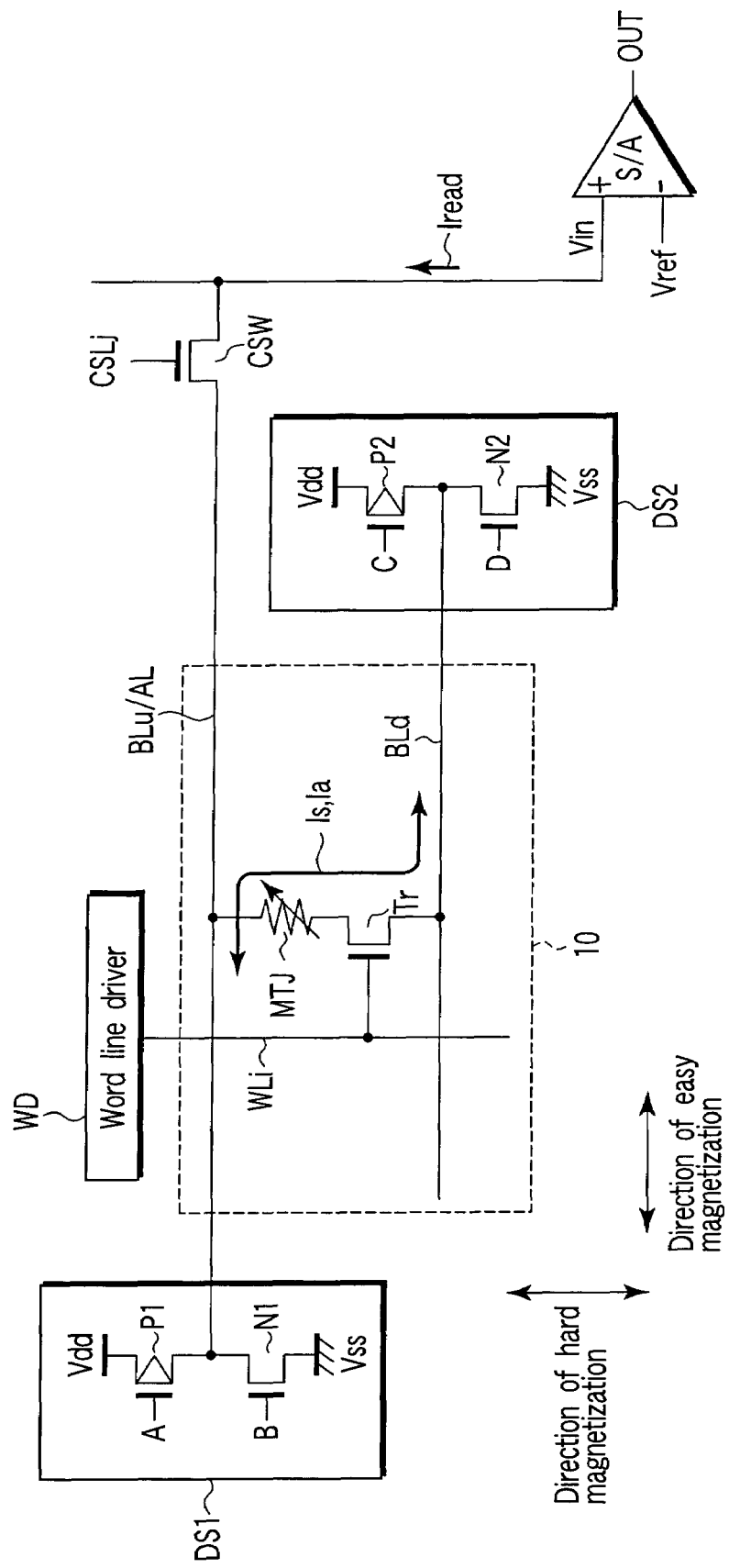
FIG. 10 is a circuit diagram showing the magnetic random access memory of a third embodiment.

FIG. 10 is a circuit diagram showing a main part of a magnetic random access memory in the third embodiment.

A magnetoresistive element MTJ constitutes a part of a memory cell array 10.

One end of the magnetoresistive element MTJ is connected to an upper bit line BLu/write assist line AL, and the other end thereof is connected to a lower bit line BLd via an N-channel MOS transistor Tr as a selection switch.

Both of the upper bit line BLu/write assist line AL and the lower bit line BLd extend in the same direction which is a direction of an easy magnetization (column direction) of the magnetoresistive element MTJ in the present example.

One end of the upper bit line BLu/write assist line AL is connected to a CMOS type driver/sinker DS1.

The driver/sinker DS1 is constituted of a P-channel MOS transistor P1 and an N-channel MOS transistor N1 connected in series between power supply terminals Vdd and Vss.

The other end of the upper bit line BLu/write assist line AL is connected to a sense amplifier S/A via an N-channel MOS transistor CSW as a selection switch.

One end of the lower bit line BLd is connected to a CMOS type driver/sinker DS2. The driver/sinker DS2 is constituted of a P-channel MOS transistor P2 and an N-channel MOS transistor N2 connected in series between power supply terminals Vdd and Vss.

A gate of the N-channel MOS transistor Tr is connected to a word line WL. The word line WL extends in a direction of a hard magnetization (row direction) of the magnetoresistive element MTJ, and one end of the word line is connected to a word line driver WD.

Since the upper bit line BLu also functions as the write assist line AL in the third embodiment in the same manner as in the second embodiment, the number of conductive lines in the memory cell array can be reduced as many as the write assist lines AL.

Moreover, when the magnetic field generated by the spin-injection current Is is used as an assist magnetic field, the driver/sinker for generating the assist current Ia is not required. In consequence, an area of a peripheral circuit of the memory cell array can be reduced.

It is to be noted that in a case where the operation of the spin-injection current is distinguished from that of the assist current, the driver/sinker having the same constitution as that of the driver/sinker DS1 may be connected to the upper bit line BLu/write assist line AL, and the driver/sinker having the same constitution as that of the driver/sinker DS2 may be connected to the lower bit line BLd to control supplying/cutting-off of the assist current by means of these drivers/sinkers.

B. Operation

An operation of the magnetic random access memory of FIG. 10 will be described.

In a write operation, a level of the word line WL is set to "H" by the word line driver WD, and the N-channel MOS transistor Tr is turned on.

When "1" is written into the magnetoresistive element MTJ, levels of control signals A and B are set to "L", and levels of control signals C and D are set to "H". In this case, since the P-channel MOS transistor P1 and the N-channel MOS transistor N2 turn on, a spin-injection current Is/assist current Ia flows through the magnetoresistive element MTJ in a direction from the driver/sinker DS1 to the driver/sinker DS2.

Spin-polarized electrons are injected into the magnetoresistive element MTJ, and the assist magnetic field is generated in a direction of a hard magnetization of the magnetoresistive element MTJ by means of this spin-injection current Is/assist current Ia.

When "0" is written into the magnetoresistive element MTJ, the levels of the control signals A and B are set to "H", and the levels of the control signals C and D are set to "L". In this case, since the P-channel MOS transistor P2 and the N-channel MOS transistor N1 turn on, the spin-injection current Is/assist current Ia flows through the magnetoresistive element MTJ in a direction from the driver/sinker DS2 toward the driver/sinker DS1.

The spin-polarized electrons are injected into the magnetoresistive element MTJ, and the assist magnetic field is generated in the direction of the hard magnetization of the magnetoresistive element MTJ by means of this spin-injection current Is/assist current Ia.

It is to be noted that the levels of the control signals A, B, C, and D may be set to "L" to pre-charge the upper bit line BLu/write assist line AL and the lower bit line BLd before passing the spin-injection current Is/assist current Ia to write the data.

Moreover, after cutting off the spin-injection current Is/assist current Ia to complete the writing, the levels of the control signals A, B, C, and D may be set to "H" to fix the upper bit line BLu/write assist line AL and the lower bit line BLd to a ground potential Vss.

In a read operation, the level of the word line WL is set to "H" via the word line driver WD, and the N-channel MOS transistor Tr is turned on. A selection signal CSLj is set to "H", and the N-channel MOS transistor CSW is turned on.

The levels of the control signals A, C, and D are set to "H", and the level of the control signal B is set to "L" to form a current path from the sense amplifier S/A to the ground point Vss via the magnetoresistive element MTJ.

Moreover, when a read current Iread is supplied from the sense amplifier S/A to the magnetoresistive element MTJ, for example, an input potential Vin of the sense amplifier S/A changes depending on data (resistance value) stored in the magnetoresistive element MTJ. Therefore, this potential is compared with a reference potential Vref to detect a data value.

It is to be noted that a value of the read current Iread is set to be smaller than that of the spin-injection current Is/assist current Ia in order to avoid disturbance during the reading.

C. Device Structure

An example of a device structure of a memory cell will be described.

Figure 11:
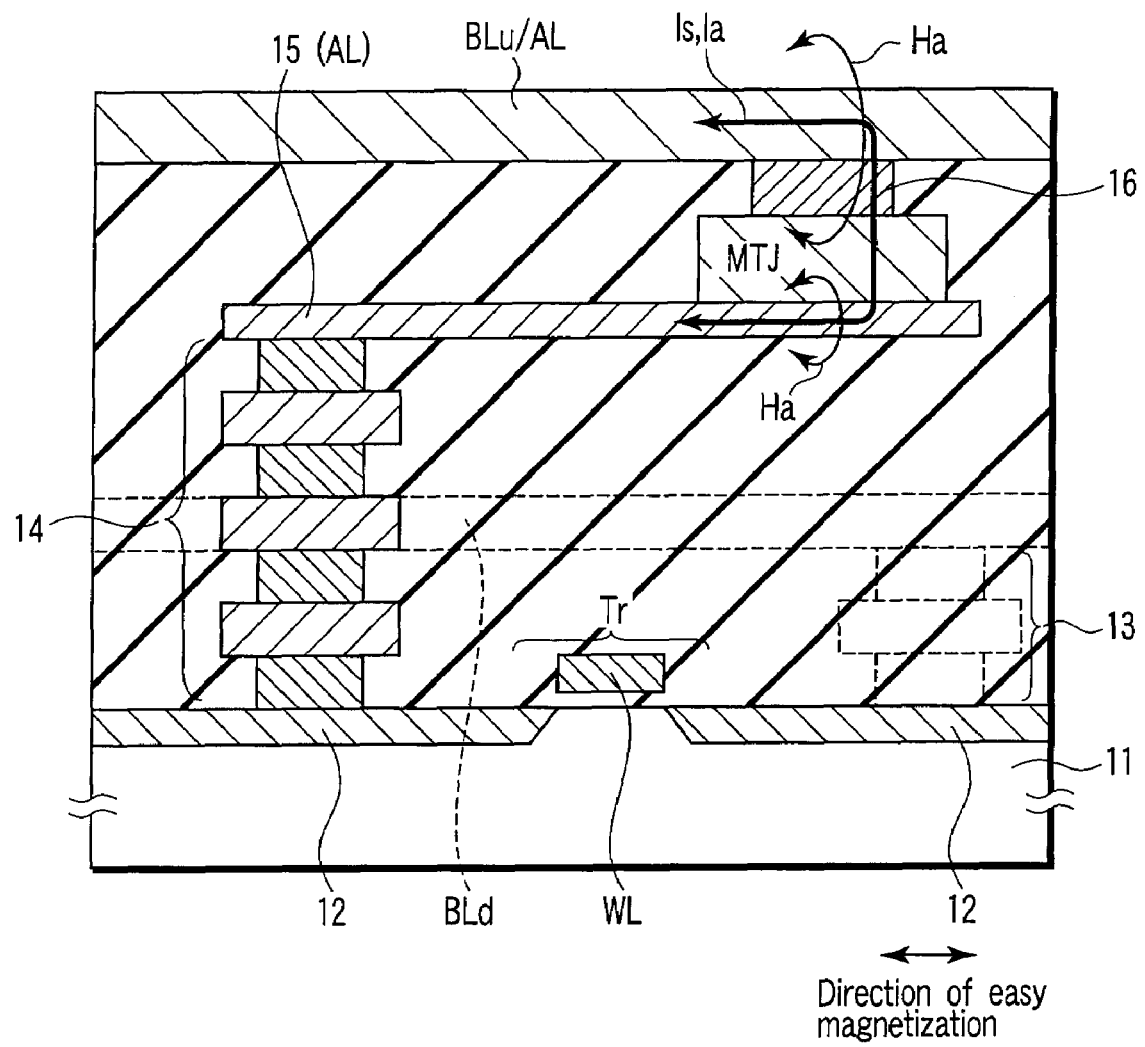
FIG. 11 is a sectional view showing a first example of the device structure of the third embodiment.

FIG. 11 shows a first example of the device structure.

This structure is a 1Tr-1MTJ structure in which the memory cell is constituted of one transistor and one magnetoresistive element.

The N-channel MOS transistor Tr is disposed as the selection switch in a surface area of a semiconductor substrate 11. The N-channel MOS transistor Tr is constituted of source/drain diffusion layers 12, and a gate electrode (word line) WL disposed above a channel between these layers.

One of the source/drain diffusion layers 12 is connected to the lower bit line BLd via an intermediate layer 13. The other source/drain diffusion layer 12 is connected to a lower electrode 15 via an intermediate layer 14.

The magnetoresistive element MTJ is disposed on the lower electrode 15.

There is not any special restriction on a shape, a structure or the like of the magnetoresistive element MTJ, but the magnetoresistive element MTJ preferably has one-direction anisotropy as a magnetic pinned layer, and a one-axis anisotropy as a magnetic recording layer.

The whole thickness of the magnetoresistive element MTJ is preferably set to a value in a range of 0.1 nm to 100 nm.

A ferromagnetic layer (magnetic pinned layer, magnetic recording layer or the like) constituting the magnetoresistive element MTJ needs to be prevented from being super-paramagnetic. To this end, the thickness of the layer is preferably set to a value of 0.4 nm or more.

The upper bit line BLu/write assist line AL is disposed on the magnetoresistive element MTJ via a contact layer 16.

In the magnetoresistive element MTJ, the spin-injection current Is/assist current Ia flows, for example, in a direction from the lower bit line BLd toward the upper bit line BLu/write assist line AL or from the upper bit line BLu/write assist line AL toward the lower bit line BLd.

Accordingly, an assist magnetic field Ha is applied to the magnetoresistive element MTJ in a direction crossing the drawing perpendicularly.

In such structure, when an intermediate layer made of an amorphous metal, a micro crystal metal or the like is disposed between the magnetoresistive element MTJ and the contact layer 16 or the lower electrode 15, a value of a switching magnetic field (reverse magnetic field) can further be reduced.

Figure 12:
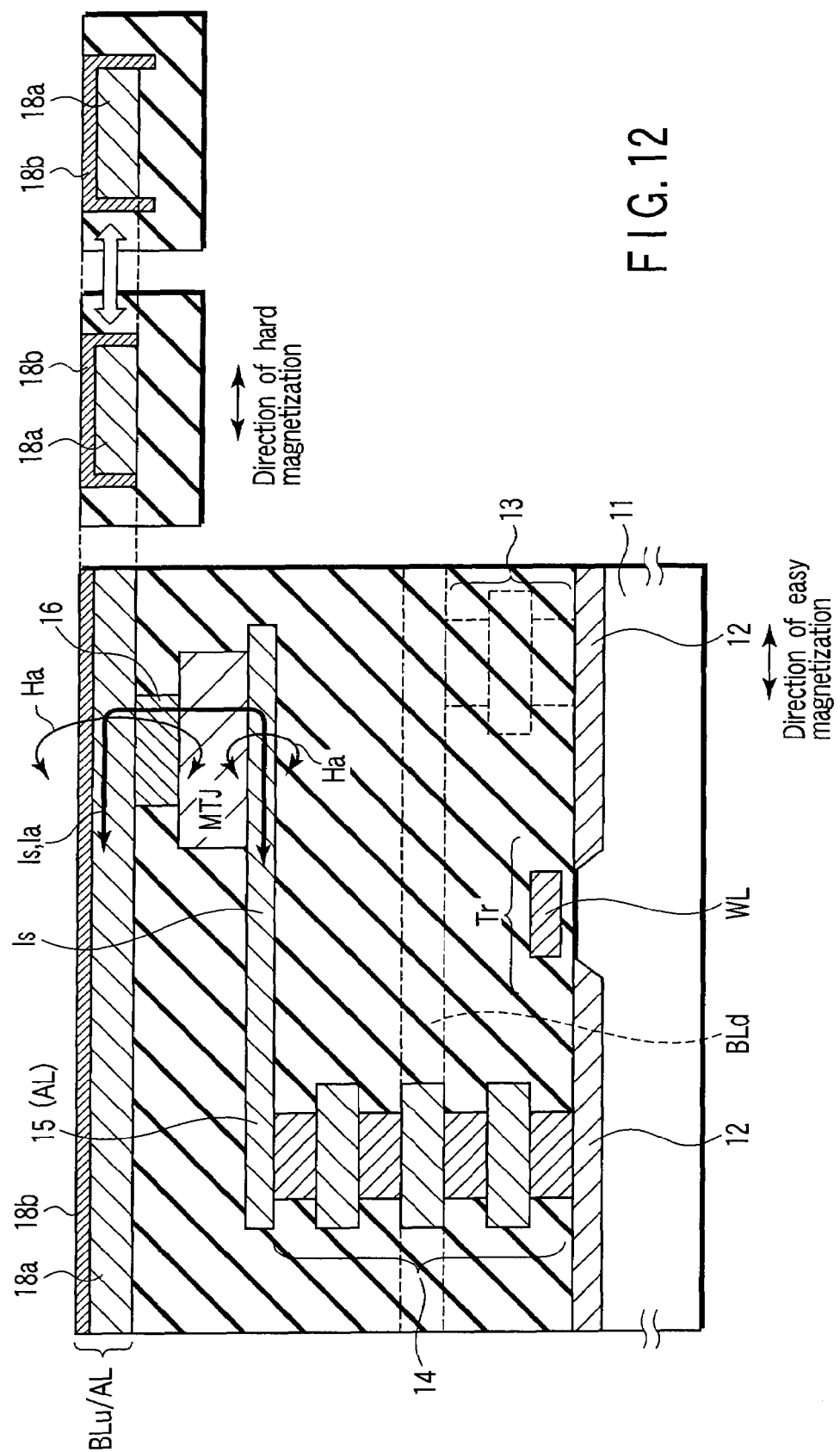
FIG. 12 is a sectional view showing a second example of the device structure of the third embodiment.

FIG. 12 shows a second example of the device structure.

A characteristic of the second example is different from that of the first example in that the upper bit line BLu/write assist line AL has a so-called yoke structure. The other respects are the same as those of the first example.

The upper bit line BLu/write assist line AL is constituted of a main body 18a made of a conductive material such as a metal or an alloy, and a high-permeability magnetic material (yoke material) 18b disposed on the top and sides of the main body 18a. The high-permeability magnetic material 18b may be of such a horned type as to protrude downwards from the underside of the main body 18a.

FIG. 13 shows a third example of the device structure.

A characteristic of the third example is different from that of the first example in that the lower electrode 15 (AL) has a so-called yoke structure, and functions as the write assist line. The other respects are the same as those of the first example.

The lower electrode 15 (AL) is constituted of a main body 19a made of a conductive material such as a metal or an alloy, and a high-permeability magnetic material (yoke material) 19b disposed on the top and sides of the main body 19a. The high-permeability magnetic material 19b may be of such a horned type as to protrude from the top of the main body 19a.

According to the third example, it is possible to realize an effect of suppressing write disturbance unlike the first and second examples.

That is, the high-permeability magnetic material 19b is applied to the lower electrode 15 (AL) disposed separately right under the magnetoresistive element MTJ. Therefore, the magnetic field applied from the lower electrode 15 (AL) to the magnetoresistive element MTJ is larger than that applied from the upper bit line BLu/write assist line AL to the magnetoresistive element MTJ. For example, unlike the second example in which the high-permeability magnetic material 19b is applied to the upper bit line BLu/write assist line AL, the assist magnetic field Ha is effectively applied to the selected magnetoresistive element MTJ only.

Figure 14:
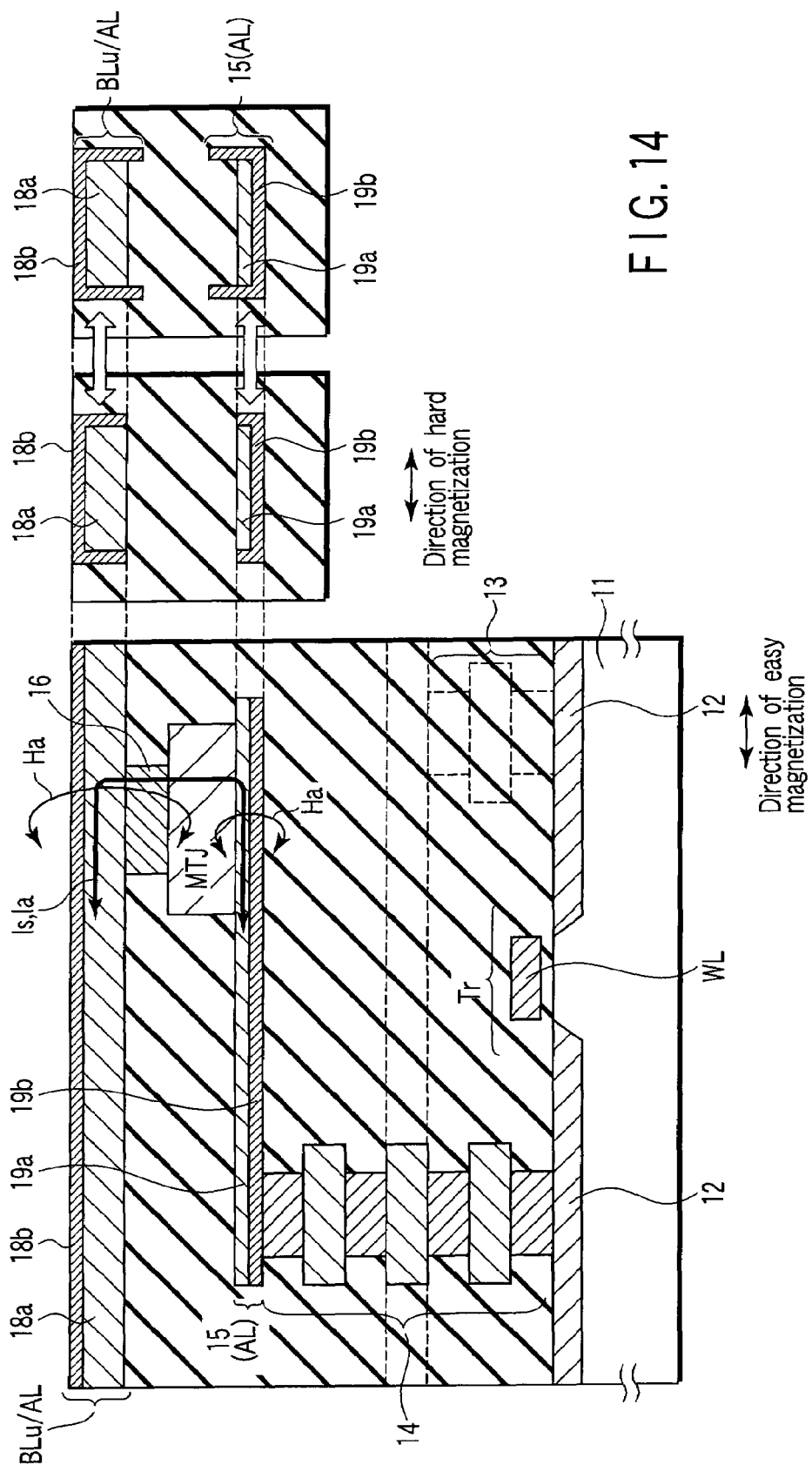
FIG. 14 is a sectional view showing a fourth example of the device structure of the third embodiment.

FIG. 14 shows a fourth example of the device structure.

The fourth example is a combination of the second and third examples, and is characterized in that the upper bit line BLu/write assist line AL and the lower electrode 15 (AL) have a so-called yoke structure. The other respects are the same as those of the first example.

The upper bit line BLu/write assist line AL is constituted of a main body 18a made of a conductive material such as a metal or an alloy, and a high-permeability magnetic material (yoke material) 18b disposed on the top and sides of the main body 18a. The high-permeability magnetic material 18b may be of such a horned type as to protrude downwards from the underside of the main body 18a.

The lower electrode 15 (AL) is constituted of a main body 19a made of a conductive material such as a metal or an alloy, and a high-permeability magnetic material (yoke material) 19b disposed on the underside and sides of the main body 19a. The high-permeability magnetic material 19b may be of such a horned type as to protrude upwards from the top of the main body 19a.

In the first to fourth examples, there has been described the 1Tr-1MTJ structure in which the memory cell is constituted of one transistor and one magnetoresistive element, but the examples of the present invention are applicable to another structure such as a three-dimensional structure in which the magnetoresistive elements MTJ are stacked.

D. Conclusions

According to the third embodiment, an effect of the reduction of the spin-injection current and an effect of the reduction of the number of conductive lines in the memory cell array can be realized. In addition, since the assist magnetic field is generated by means of the spin-injection current, an area of the driver/sinker as a peripheral circuit of the memory cell array can be reduced.

(4) Fourth Embodiment

A fourth embodiment is an example in which a permanent magnet is used in generation of an assist magnetic field.

A. First Example

FIG. 15 is a circuit diagram showing a first example of a magnetic random access memory in the fourth embodiment.

The first example is characterized in that a write assist line AL of the first embodiment is constituted of a permanent magnet, and the other respects are the same as those of the first embodiment.

A write assist line AL is disposed in the vicinity of a magnetoresistive element MTJ, and extends in a direction of an easy magnetization. Since the write assist line AL is the permanent magnet, any assist current does not have to be passed through the line. Therefore, the write assist line AL is not connected to any driver/sinker for generating the assist current.

During writing, a level of a word line WL is set to "H" by a word line driver WD, and an N-channel MOS transistor Tr is turned on.

When "1" is written into the magnetoresistive element MTJ, levels of control signals A and B are set to "L", and levels of control signals C and D are set to "H". In this case, since a P-channel MOS transistor P1 and an N-channel MOS transistor N2 turn on, a spin-injection current Is flows through the magnetoresistive element MTJ in a direction from a driver/sinker DS1 to a driver/sinker DS2.

When "0" is written into the magnetoresistive element MTJ, the levels of the control signals A and B are set to "H", and the levels of the control signals C and D are set to "L". In this case, since a P-channel MOS transistor P2 and an N-channel MOS transistor N1 turn on, the spin-injection current Is flows through the magnetoresistive element MTJ in a direction from the driver/sinker DS2 to the driver/sinker DS1.

In usual times including the write time, an assist magnetic field of a direction of a hard magnetization is applied to the magnetoresistive element MTJ via the write assist line AL as the permanent magnet.

In a read operation, the level of the word line WL is set to "H" via the word line driver WD, and the N-channel MOS transistor Tr is turned on. A selection signal CSLj is set to "H", and an N-channel MOS transistor CSW is turned on.

The levels of the control signals A, C, and D are set to "H", and the level of the control signal B is set to "L" to form a current path from a sense amplifier S/A to a ground point Vss via the magnetoresistive element MTJ.

Moreover, when a read current Iread is supplied from the sense amplifier S/A to the magnetoresistive element MTJ, for example, an input potential Vin of the sense amplifier S/A changes depending on data (resistance value) stored in the magnetoresistive element MTJ. Therefore, this potential is compared with a reference potential Vref to detect a data value.

It is to be noted that a value of the read current Iread is set to be smaller than that of the spin-injection current Is in order to avoid disturbance during the reading.

Figure 16:
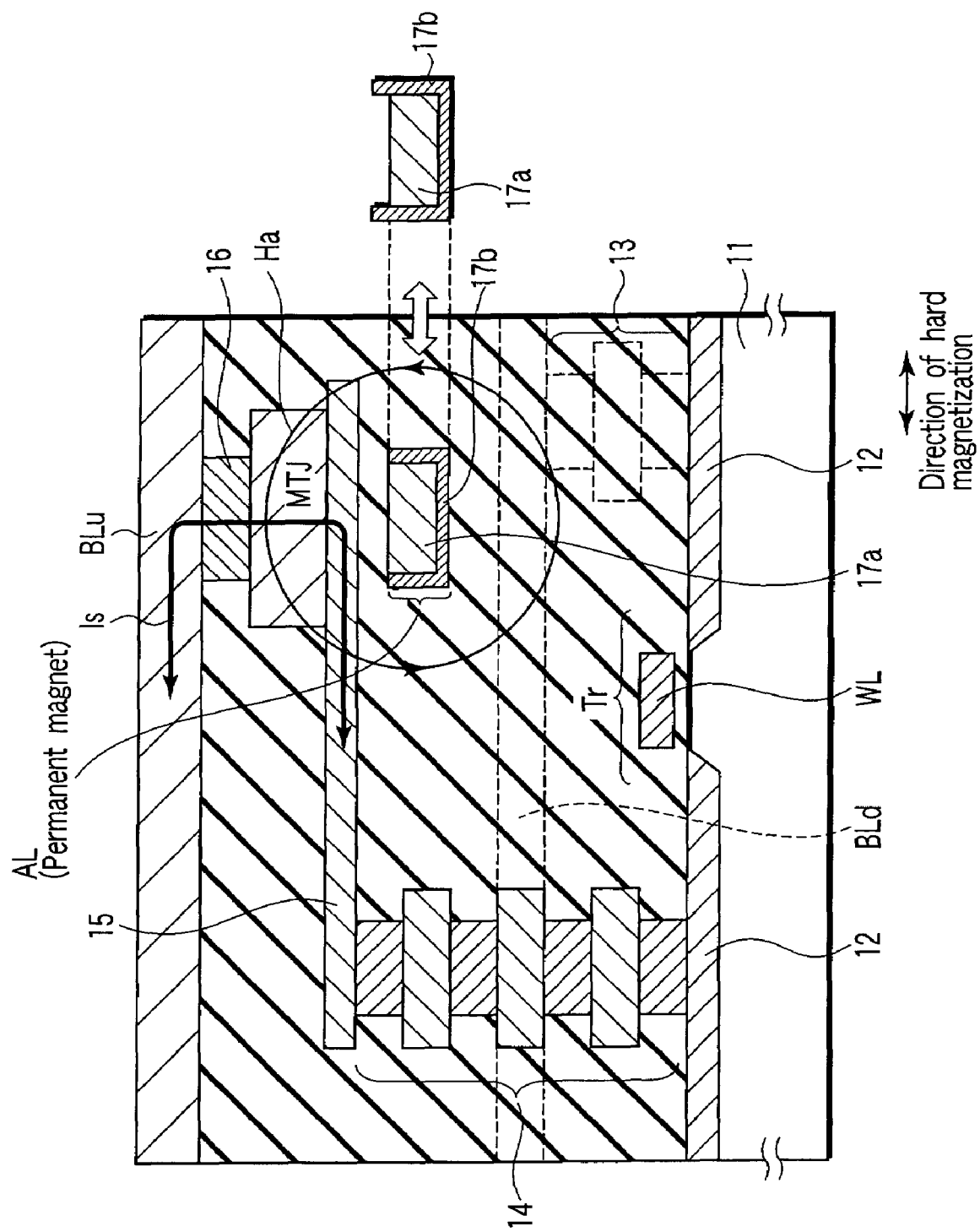
FIG. 16 is a sectional view showing an example of the device structure of a memory cell of FIG. 15.

FIG. 16 shows an example of a device structure of a memory cell applied to the magnetic random access memory of FIG. 15.

The write assist line AL has a yoke structure, and is disposed under the magnetoresistive element MTJ.

The write assist line AL is constituted of a main body 17a constituted of the permanent magnet, and a high-permeability magnetic material 17b disposed on the undersides and sides of the main body 17a. The high-permeability magnetic material 17b may be of such a horned type as to protrude upwards from the top of the main body 17a.

In such structure, when an intermediate layer made of an amorphous metal, a micro crystal metal or the like is disposed between the magnetoresistive element MTJ and a contact layer 16 or a lower electrode 15, a value of a switching magnetic field (reverse magnetic field) can further be reduced.

B. Second Example

Figure 17:
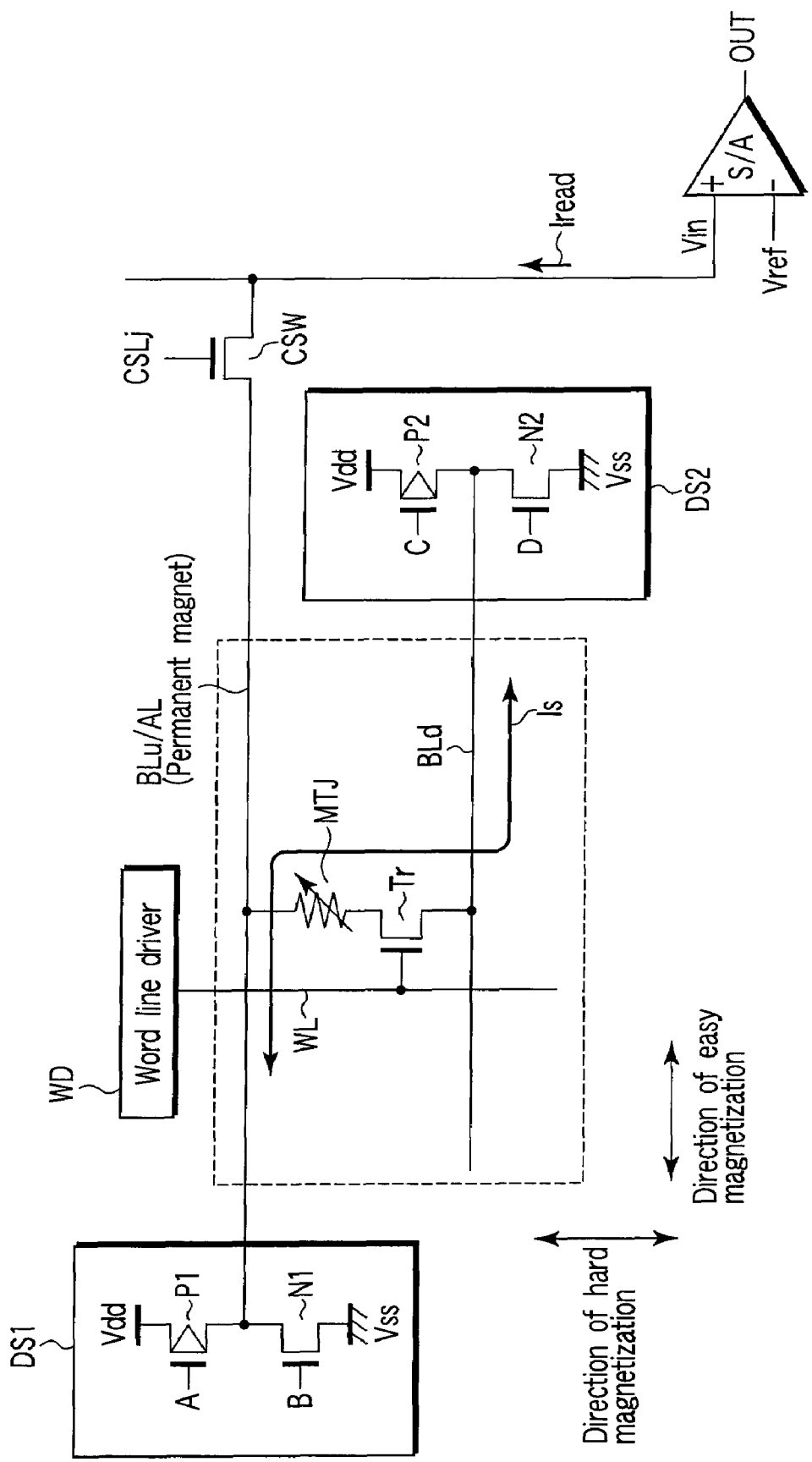
FIG. 17 is a circuit diagram showing the magnetic random access memory of the fourth embodiment.

FIG. 17 is a circuit diagram showing a second example of a main part of a magnetic random access memory in the fourth embodiment.

The second example is characterized in that write assist lines of the second and third embodiments are constituted of permanent magnets, and the other respects are the same as those of the second and third embodiments.

An upper bit line BLu/write assist line AL is disposed in the vicinity of a magnetoresistive element MTJ, and extends in a direction of an easy magnetization. Since the upper bit line BLu/write assist line AL is the permanent magnet, any assist current does not have to be passed through the line. Therefore, the upper bit line BLu/write assist line AL is not connected to any driver/sinker for generating the assist current.

During writing, a level of a word line WL is set to "H" by a word line driver WD, and an N-channel MOS transistor Tr is turned on.

When "1" is written into the magnetoresistive element MTJ, levels of control signals A and B are set to "L", and levels of control signals C and D are set to "H". In this case, since a P-channel MOS transistor P1 and an N-channel MOS transistor N2 turn on, a spin-injection current Is flows through the magnetoresistive element MTJ in a direction from a driver/sinker DS1 to a driver/sinker DS2.

When "0" is written into the magnetoresistive element MTJ, the levels of the control signals A and B are set to "H", and the levels of the control signals C and D are set to "L". In this case, since a P-channel MOS transistor P2 and an N-channel MOS transistor N1 turn on, the spin-injection current Is flows through the magnetoresistive element MTJ in a direction from the driver/sinker DS2 to the driver/sinker DS1.

In usual times including the write time, an assist magnetic field of a direction of a hard magnetization is applied to the magnetoresistive element MTJ via the upper bit line BLu/write assist line AL as the permanent magnet.

In a read operation, the level of the word line WL is set to "HI" via the word line driver WD, and the N-channel MOS transistor Tr is turned on. A selection signal CSLj is set to "H", and an N-channel MOS transistor CSW is turned on.

The levels of the control signals A, C, and D are set to "H", and the level of the control signal B is set to "L" to form a current path from a sense amplifier S/A to a ground point Vss via the magnetoresistive element MTJ.

Moreover, when a read current Iread is supplied from the sense amplifier S/A to the magnetoresistive element MTJ, for example, an input potential Vin of the sense amplifier S/A changes depending on data (resistance value) stored in the magnetoresistive element MTJ. Therefore, this potential is compared with a reference potential Vref to detect a data value.

It is to be noted that a value of the read current Iread is set to be smaller than that of the spin-injection current Is in order to avoid disturbance during the reading.

Figure 18:
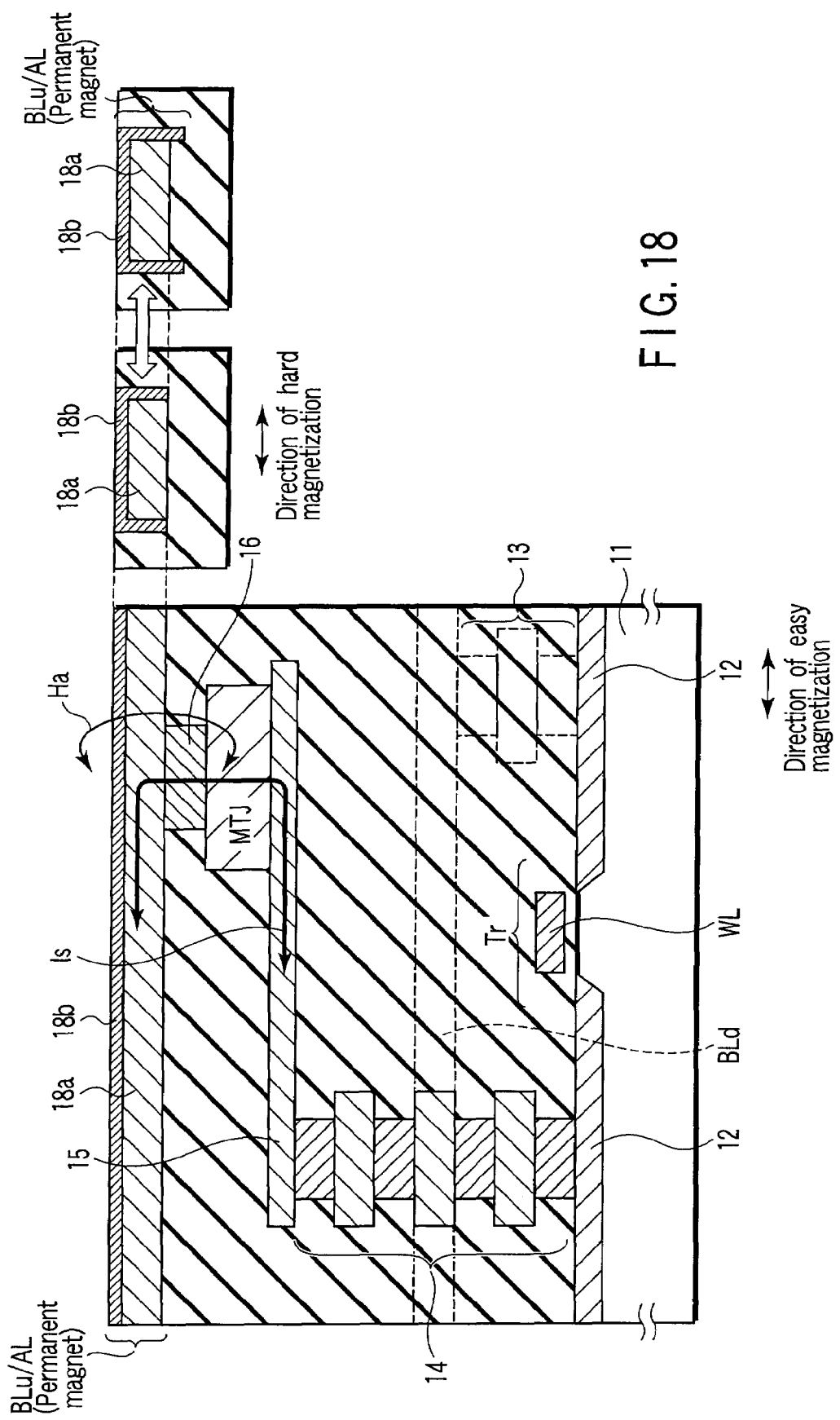
FIG. 18 is a sectional view showing an example of the device structure of a memory cell of FIG. 17.

FIG. 18 shows an example of a device structure of a memory cell applied to the magnetic random access memory of FIG. 17.

The upper bit line BLu/write assist line AL has a yoke structure, and is disposed above the magnetoresistive element MTJ.

The upper bit line BLu/write assist line AL is constituted of a main body 18a constituted of the permanent magnet, and a high-permeability magnetic material 18b disposed on the top and sides of the main body 18a. The high-permeability magnetic material 18b may be of such a horned type as to protrude downwards from the underside of the main body 18a.

In such structure, when an intermediate layer made of an amorphous metal, a micro crystal metal or the like is disposed between the magnetoresistive element MTJ and a contact layer 16 or a lower electrode 15, a value of a switching magnetic field (reverse magnetic field) can further be reduced.

FIG. 19 shows an example in which a lower electrode is constituted of the permanent magnet in the device structure of FIG. 13.

A lower electrode 15 (AL permanent magnet) has a yoke structure, and is disposed under a magnetoresistive element MTJ.

The lower electrode 15 (AL permanent magnet) is constituted of a main body 19a constituted of the permanent magnet, and a high-permeability magnetic material 19b disposed on the underside and sides of the main body 19a. The high-permeability magnetic material 19b may be of such a horned type as to protrude upwards from the top of the main body 19a.

In such structure, when an intermediate layer made of an amorphous metal, a micro crystal metal or the like is disposed between the magnetoresistive element MTJ and a contact layer 16 or the lower electrode 15 (AL permanent magnet), a value of a switching magnetic field (reverse magnetic field) can further be reduced.

C. Conclusions

According to the fourth embodiment, the magnetization reversal is assisted using the assist magnetic field of the direction of the hard magnetization during the writing by the spin-injection magnetization reversal method. Consequently, the spin-injection currents can be reduced.

Moreover, since the assist magnetic field is generated by the permanent magnet, any driver/sinker for generating the assist current is not required. Furthermore, when the upper bit line/write assist line or the lower electrode are constituted of the permanent magnets, the number of conductive lines in the memory cell array can be reduced.

(5) Fifth Embodiment

A fifth embodiment is characterized in that a magnetoresistive element is of an edge junction type.

Figure 20:
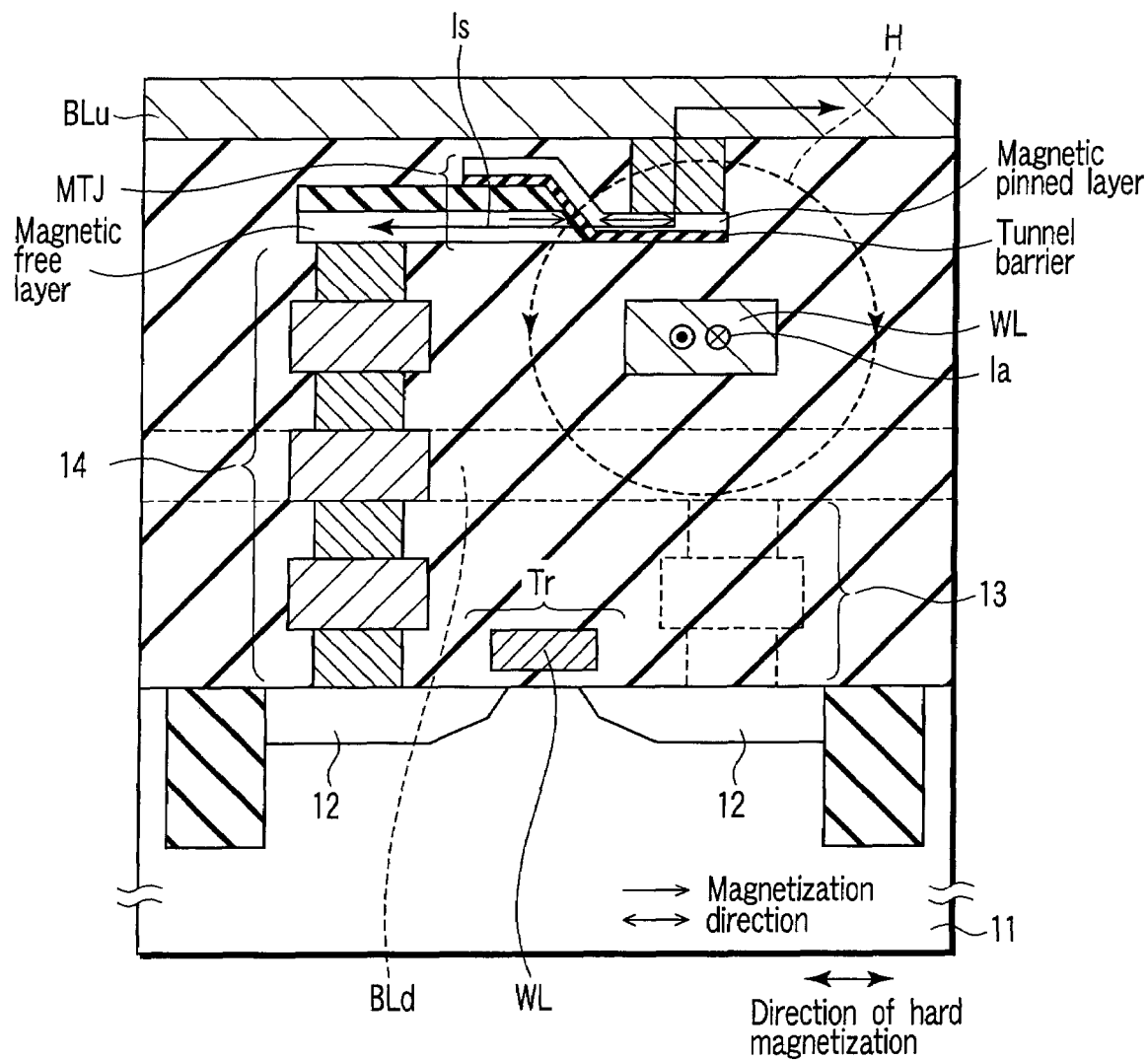
FIG. 20 is a sectional view showing an example of a device structure of a fifth embodiment.

FIG. 20 shows an example of a device structure of a magnetic random access memory in the fifth embodiment.

A magnetoresistive element MTJ is an edge junction type tunnel magnetoresistive element, and a tunnel barrier layer is formed on sides (bold-line portions) of a magnetic pinned layer. Therefore, a junction area between the magnetic pinned layer and the tunnel barrier layer can be defined by a thickness of the magnetic pinned layer, and fluctuations of characteristics between the elements can be reduced.

During writing, a spin-injection current Is for reversing spin-injection magnetization is passed through the magnetoresistive element MTJ.

For example, when the spin-injection current Is is passed from an upper bit line BLu to a lower bit line BLd, a magnetization direction of a magnetic recording layer becomes identical to that of the magnetic pinned layer (parallel state). When the spin-injection current Is is passed from the lower bit line BLd toward the upper bit line BLu, the magnetization direction of the magnetic recording layer becomes reverse to that of the magnetic pinned layer (non-parallel state).

During writing, an assist current Ia having a direction depending on a value of write data is passed through a word line WL. The assist current Ia generates an assist magnetic field Ha in a direction of a hard magnetization of the magnetic recording layer of the magnetoresistive element MTJ.

The fifth embodiment can be combined with the first to fourth embodiments to realize effects similar to those of these embodiments.

3. Magnetization Reversal Process

There will be described a method of writing data (magnetization reversal process) using an architecture of the example of the present invention.

Figure 21:
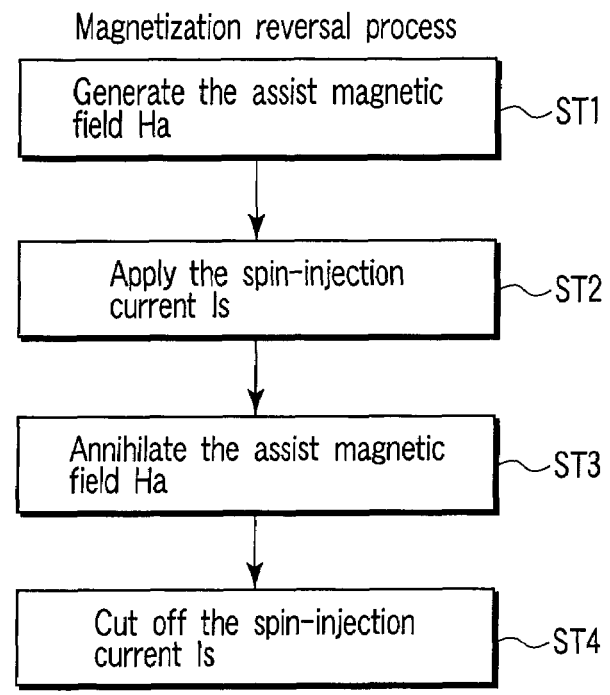
FIG. 21 is a diagram showing a flow of a magnetization reversal process.

FIG. 21 shows a flow or the magnetization reversal process in the example of the present invention. FIG. 22 shows signal waveforms of a spin-injection current and an assist current (assist magnetic field) for realizing the process of FIG. 21.

First, the assist magnetic field Ha is generated, and the spin-injection current Is directed depending on the value of the write data is applied to the magnetoresistive element (steps ST1 and ST2). Here, a point to generate the assist magnetic field Ha may be a point (time t1) before passing the spin-injection current Is as shown in FIG. 22(a), a point (time t2) simultaneous with the passing of the current as shown in FIG. 22(b), or a point (time t3) after passing the current as shown in FIG. 22(c).

The spin-injection current Is generates spin-polarized electrons, a spin torque acts on the magnetic recording layer owing to the spin-polarized electrons, and the magnetization reversal of the magnetic recording layer is started. The assist magnetic field Ha assists the magnetization reversal.

In the example of the present invention, since the assist magnetic field Ha has a main purpose of reducing the value of the spin-injection current Is, the assist magnetic field Ha is generated in the direction of the hard magnetization of the magnetoresistive element.

It is to be noted that, for example, as disclosed in the invention of Jpn. Pat. Appln. No. 2005-21877, the assist magnetic field of the direction of the easy magnetization is generated for the purpose of suppressing thermal disturbance during the magnetization reversal. This can be combined with the example of the present invention for use.

Next, after annihilating the assist magnetic field Ha, the spin-injection current Is is cut off (steps ST3 and ST4). To allow the assist magnetic field Ha to act in the direction of the hard magnetization of the magnetoresistive element, a point (time t4) to cut off the assist current Ia can be set before a point (time t5) to cut off the spin-injection current Is to accelerate the writing (magnetization reversal).

4. Magnetoresistive Element

There is not any special restriction on a material, a structure, and a shape in the example of the present invention. They are determined in consideration of destruction of a tunnel barrier, thermal disturbance due to a temperature rise of the magnetoresistive element.

For example, the magnetoresistive element may have a synthetic anti-ferromagnetic (SAF) structure. In addition, it is possible to use a material and a structure disclosed in Jpn. Pat. Appln. No. 2005-21877.

It is to be noted that the amorphous metal or the micro crystal metal disposed right under or above the magnetoresistive element can be selected from the following:

an alloy containing at least one element selected from the group consisting of Ti, Zr, Hf, V, Nb, Ta, Cr, Mo, and W and at least one element selected from the group consisting of Pt, Pd, Ru, Rh, Ir, Os, Re, Au, and Al;
  an alloy containing at least one element selected from the group consisting of Ti, Zr, Hf, V, Nb, Ta, Cr, Mo, and W and at least one element selected from the group consisting of Fe, Ni, Cr, and Cu;
  an alloy containing at least one element selected from the group consisting of Pr, Nd, Pm, Sm, Eu, Gd, Tb, Dy, Ho, Er, Tm, Yb, and Lu and at least one element selected from the group consisting of Pt, Pd, Ru, Rh, Ir, Os, Re, Au, and Al; and
  one selected from the group consisting of indium-titan-oxide, indium-zinc-oxide, Al-oxide, and Al-nitride.

5. Experimental Example

There will be described experimental examples in a case where the examples of the present invention are specifically carried out. It is to be noted that in the following description, numeric values in parentheses after materials indicate thicknesses of the materials.

(1) First Experimental Example

Figure 23:
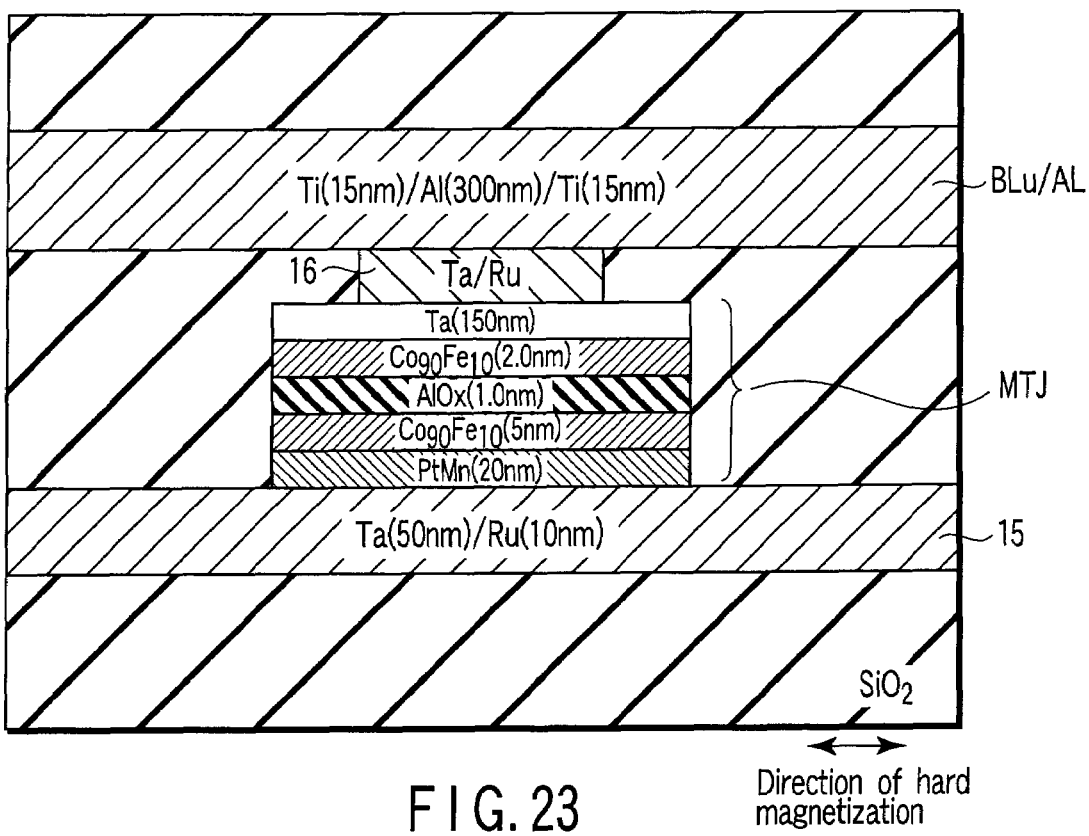
FIG. 23 is a sectional view showing a device structure of a first experimental example.

FIG. 23 shows a device structure in a first experimental example.

A lower electrode 15 is constituted of a laminate of Ta (50 nm)/Ru (10 um). A magnetoresistive element MTJ is formed on the lower electrode 15.

An antiferromagnetic layer of the magnetoresistive element MTJ is constituted of PtMn (20 nm). A magnetic pinned layer is constituted of $Co_{90}Fe_{10}$ (5 nm). A tunnel barrier layer is constituted of AlOx (1.9 nm). A magnetic recording layer is constituted of $Co_{90}Fe_{10}$ (2.0 nm). Moreover, a contact layer is constituted of Ta (150 nm).

These materials are successively formed by, for example, a sputtering process.

To be more specific, the tunnel barrier layer is constituted of AlOx (1.0 nm) by repeating twice a process of forming Al having a thickness of 0.5 nm by the sputtering process, and naturally oxidizing the material in-situ by use of pure oxygen.

When the thickness of AlOx was checked with a sectional transmission electron microscope (TEM) after completing the device, the thickness of AlOx increased from 1.0 nm to 1.2 nm. This is supposedly caused by the natural oxidation after forming AlOx (1.0 nm).

As to a tunnel junction of the magnetoresistive element MTJ, patterns are transferred to a portion defining a junction area by use of an electron beam (EB) drawing device, and to another portion by use of a KrF stepper device. Thereafter, the junction is separated using Ar ion milling to form a tunnel junction.

An upper bit line BLu/write assist line AL is formed on the magnetoresistive element MTJ via a contact layer 16.

The contact layer 16 is constituted of a laminate of Ta/Ru, and the upper bit line BLu/write assist line AL is constituted of Ti (15 nm)/Al (300 nm)/Ti (15 nm).

The top of the contact layer 16 is coated with $SiO_2$, and thereafter exposed from $SiO_2$ by performing etch-back.

The upper bit line BLu/write assist line AL is formed by forming a laminate of Ti (15 nm)/Al (300 nm)/Ti (15 nm) by the sputtering process, and thereafter etching this laminate by a reactive ion etching (RIE) process.

One-axis anisotropy is imparted to the magnetic recording layer of the magnetoresistive element MTJ by annealing the layer at about 280° C. for about ten hours while applying a magnetic field in a longitudinal-axis direction of the magnetic recording layer.

As to such sample, a value of a spin-injection current required for magnetization reversal is verified.

First, a value of a magnetic field Hx of a direction of an easy magnetization and that of a magnetic field Hy of a direction of a hard magnetization are determined, and applied as an assist magnetic field to the magnetoresistive element MTJ. Next, a pulse voltage is applied to the magnetoresistive element MTJ to pass the spin-injection current. Moreover, in this case, a resistance value of the magnetoresistive element MTJ is measured by a direct-current four-terminal process.

The above-described steps were repeatedly performed, and a relation between the spin-injection current and the assist magnetic field was compiled. As a result, it has been found that the value of the spin-injection current required for the magnetization reversal is 3.5 mA in a case where the magnetic field Hy of the direction of the hard magnetization is not applied (Hy=0), whereas the value of the spin-injection current required for the magnetization reversal is 1.5 mA in a case where the magnetic field Hy of the direction of the hard magnetization is applied (Hy=20 Oe).

As described above, it is possible to perform the magnetization reversal with a spin-injection current which is smaller than before by use of the magnetic field Hy of the direction of the hard magnetization as an assist of the magnetization reversal in the spin-injection magnetization reversal process.

(2) Second Experimental Example

FIG. 24 shows a device structure in a second experimental example.

A lower electrode 15 is constituted of a laminate of amorphous TiAl (10 nm)/Ta (50 nm)/Ru (10 um). A magnetoresistive element MTJ is formed on the lower electrode 15.

An antiferromagnetic layer of the magnetoresistive element MTJ is constituted of PtMn (20 nm). A magnetic pinned layer is constituted of $Co_{90}Fe_{10}$ (5 nm). A tunnel barrier layer is constituted of AlOx (1.0 nm). A magnetic recording layer is constituted of $Co_{90}Fe_{10}$ (2.0 nm). Moreover, a contact layer is constituted of a laminate of Ta (150 nm)/amorphous TiAl (10 nm).

These materials are successively formed by, for example, a sputtering process.

To be more specific, the tunnel barrier layer is constituted of AlOx (1.0 nm) by repeating twice a process of forming Al having a thickness of 0.5 nm by the sputtering process, and naturally oxidizing the material in-situ by use of pure oxygen.

When the thickness of AlOx was checked with a sectional transmission electron microscope (TEM) after completing the device, the thickness of AlOx increased from 1.0 nm to 1.2 nm. This is supposedly caused by the natural oxidation after forming AlOx (1.0 nm).

As to a tunnel junction of the magnetoresistive element MTJ, patterns are transferred to a portion defining a junction area by use of an electron beam (EB) drawing device, and to another portion by use of a KrF stepper device. Thereafter, the junction is separated using Ar ion milling to form a tunnel junction.

An upper bit line BLu/write assist line AL is formed on the magnetoresistive element MTJ via a contact layer 16.

The contact layer 16 is constituted of a laminate of Ta/Ru, and the upper bit line BLu/write assist line AL is constituted of Ti (15 nm)/Al (300 nm)/Ti (15 nm), and has a yoke structure whose top and sides are coated with a high-permeability magnetic material (NiFe).

One-axis anisotropy is imparted to the magnetic recording layer of the magnetoresistive element MTJ by, for example, annealing the layer at about 280° C. for about ten hours while applying a magnetic field in a longitudinal-axis direction of the magnetic recording layer.

As to such sample, a value of a spin-injection current required for magnetization reversal is verified.

First, a value of a magnetic field Hx of a direction of an easy magnetization and that of a magnetic field Hy of a direction of a hard magnetization are determined, and applied as an assist magnetic field to the magnetoresistive element MTJ. Next, a pulse voltage is applied to the magnetoresistive element MTJ to pass the spin-injection current. Moreover, in this case, a resistance value of the magnetoresistive element MTJ is measured by a direct-current four-terminal process.

The above-described steps were repeatedly performed, and a relation between a path of the spin-injection current and the value of the current was compiled. As a result, it has been found that the value of the spin-injection current required for the magnetization reversal is 3.7 mA in a case where a pulse voltage is applied between a terminal a of the lower electrode 15 and a terminal d of the upper bit line BLu/write assist line AL, whereas the value of the spin-injection current required for the magnetization reversal is 3.1 mA in a case where the pulse voltage is applied between the terminal a of the lower electrode 15 and a terminal c of the upper bit line BLu/write assist line AL.

This means that in the vicinity of the magnetoresistive element MTJ, it is more preferable for reduction of the spin-injection current to turn 180-degrees in a position of the magnetoresistive element MTJ.

This is because the lower electrode 15 is under the magnetoresistive element MTJ, and the upper bit line BLu/write assist line AL is disposed on the magnetoresistive element MTJ. That is, in a case where the path of the spin-injection current is constantly directed in only one direction, magnetic fields due to currents flowing through the lower electrode 15 and the upper bit line BLu/write assist line AL cancel each other. On the other hand, in a case where the path of the spin-injection current turns 180-degrees in the position of the magnetoresistive element MTJ, the magnetic fields due to the currents flowing through the lower electrode 15 and the upper bit line BLu/write assist line AL strengthen each other.

As described above, the spin-injection current can be reduced in a case where the path of the spin-injection current (assist current) turns 180-degrees in the position of the magnetoresistive element MTJ rather than a case where the path is constantly directed in only one direction in the vicinity of the magnetoresistive element MTJ.

It is to be noted that as shown in FIG. 7, in a case where a path to pass the spin-injection current Is changes depending on a direction to pass the current Is (a case where the current path turns 180-degrees in the position of the magnetoresistive element MTJ and a case where the current path does not turn), the value of the spin-injection current required for the magnetization reversal becomes smaller in the 180-degrees turn current path than in the current path which does not turn.

On the other hand, in general, the value of the spin-injection current required for a case where the magnetization of the magnetic recording layer of the magnetoresistive element MTJ which is non-parallel with that of the magnetic pinned layer changes to be parallel becomes smaller than the value of the spin-injection current required for a case where the parallel magnetization changes to the non-parallel magnetization. Therefore, considering that the spin-injection current Is indicates an equal value irrespective of the flowing direction, the magnetoresistive element MTJ is preferably constituted so that the 180-degrees turn current path changes from the parallel path to the non-parallel path and the current path which does not turn changes from the non-parallel path to the parallel path.

Consequently, it is possible to reduce the value of the spin-injection current required for the magnetization reversal. For example, as shown in FIGS. 23 to 27, the structure of the magnetoresistive element MTJ in which the magnetic pinned layer is disposed below and the magnetic recording layer is disposed above may be applied to the example of FIG. 7.

(3) Third Experimental Example

Figure 25:
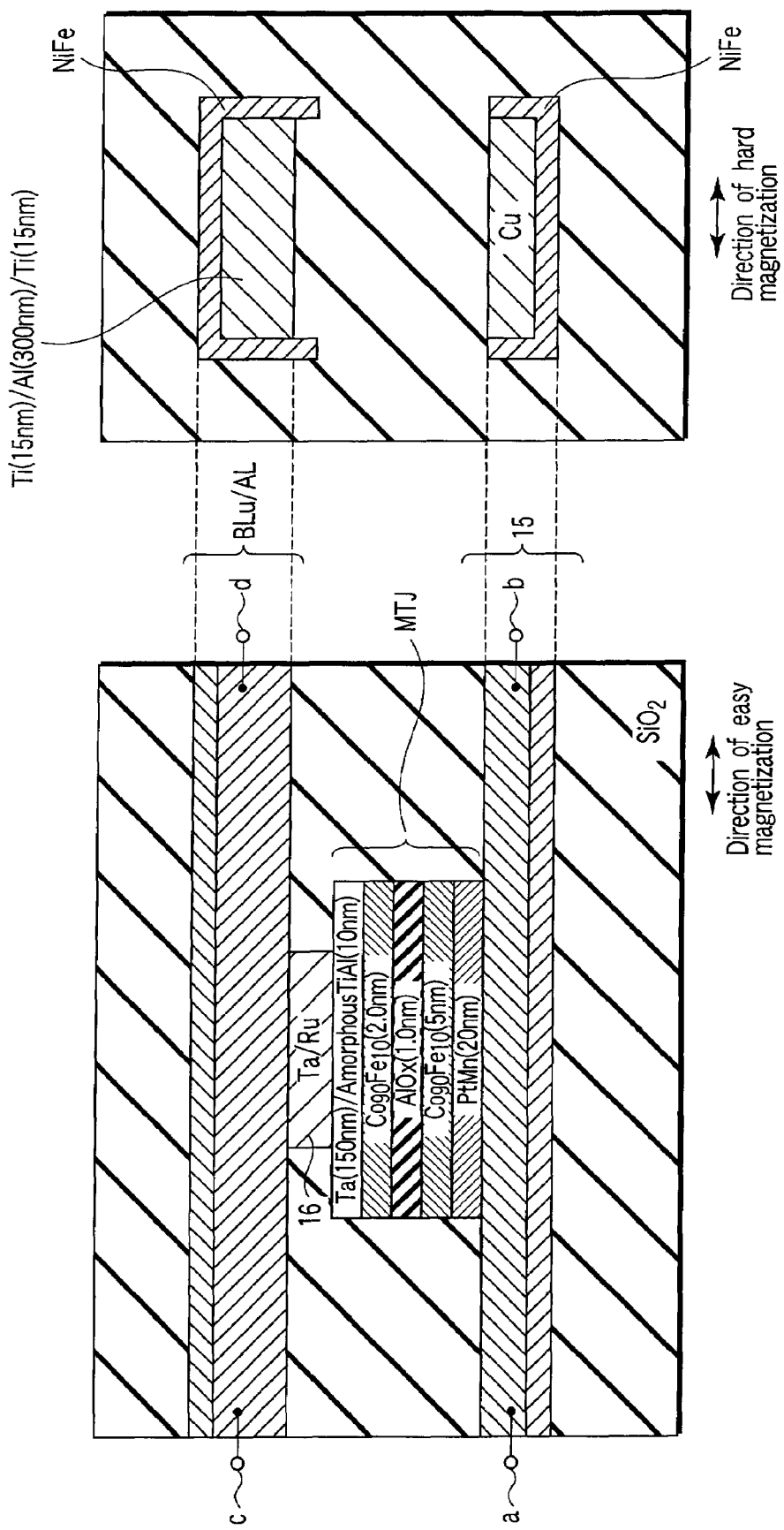
FIG. 25 is a sectional view showing a device structure of a third experimental example.

FIG. 25 shows a device structure in a third experimental example.

A lower electrode 15 is made of Cu, and has a yoke structure whose underside and sides are coated with a high-permeability magnetic material (NiFe). A magnetoresistive element MTJ is formed on the lower electrode 15.

An antiferromagnetic layer of the magnetoresistive element MTJ is constituted of PtMn (20 nm). A magnetic pinned layer is constituted of $Co_{90}Fe_{10}$ (5 nm). A tunnel barrier layer is constituted of AlOx (1.0 nm). A magnetic recording layer is constituted of $Co_{90}Fe_{10}$ (2.0 nm). Moreover, a contact layer is constituted of a laminate of Ta (150 nm)/amorphous TiAl (10 nm).

These materials are successively formed by, for example, a sputtering process.

To be more specific, the tunnel barrier layer is constituted of AlOx (1.0 nm) by repeating twice a process of forming Al having a thickness of 0.5 nm by the sputtering process, and naturally oxidizing the material in-situ by use of pure oxygen.

When the thickness of AlOx was checked with a sectional transmission electron microscope (TEM) after completing the device, the thickness of AlOx increased from 1.0 nm to 1.2 nm. This is supposedly caused by the natural oxidation after forming AlOx (1.0 nm).

As to a tunnel junction of the magnetoresistive element MTJ, patterns are transferred to a portion defining a junction area by use of an electron beam (EB) drawing device, and to another portion by use of a KrF stepper device. Thereafter, the junction is separated using Ar ion milling to form a tunnel junction.

An upper bit line BLu/write assist line AL is formed on the magnetoresistive element MTJ via a contact layer 16.

The contact layer 16 is constituted of a laminate of Ta/Ru, and the upper bit line BLu/write assist line AL is constituted of a laminate of Ti (15 nm)/Al (300 nm)/Ti (15 nm), and has a yoke structure whose top and sides are coated with a high-permeability magnetic material (NiFe).

One-axis anisotropy is imparted to the magnetic recording layer of the magnetoresistive element MTJ by annealing the layer at about 280° C. for about ten hours while applying a magnetic field in a longitudinal-axis direction of the magnetic recording layer.

As to such sample, a value of a spin-injection current required for magnetization reversal is verified.

First, a value of a magnetic field Hx of a direction of an easy magnetization and that of a magnetic field Hy of a direction of a hard magnetization are determined, and applied as an assist magnetic field to the magnetoresistive element MTJ. Next, a pulse voltage is applied to the magnetoresistive element MTJ to pass the spin-injection current. Moreover, in this case, a resistance value of the magnetoresistive element MTJ is measured by a direct-current four-terminal process.

The above-described steps were repeatedly performed, and a relation between a path and a value of the spin-injection current was compiled. As a result, it has been found that the value of the spin-injection current required for the magnetization reversal is 2.9 mA in a case where a pulse voltage is applied between a terminal a of the lower electrode 15 and a terminal c of the upper bit line BLu/write assist line AL. This indicates that the value of the spin-injection current decreases from 3.1 mA to 2.9 mA as compared with the path is the same as that of the spin-injection current (assist current) of the second experimental example.

This is because the lower electrode 15 also has the yoke structure in the third experimental example unlike the second experimental example. That is, when the lower electrode 15 and the upper bit line BLu/write assist line AL are both formed into the yoke structures, the assist magnetic field can be efficiently applied to the magnetoresistive element MTJ.

As described above, both of the lower electrode 15 and the upper bit line BLu/write assist line AL are preferably formed into the yoke structures in respect of the reduction of the spin-injection current.

(4) Fourth Experimental Example

Figure 26:
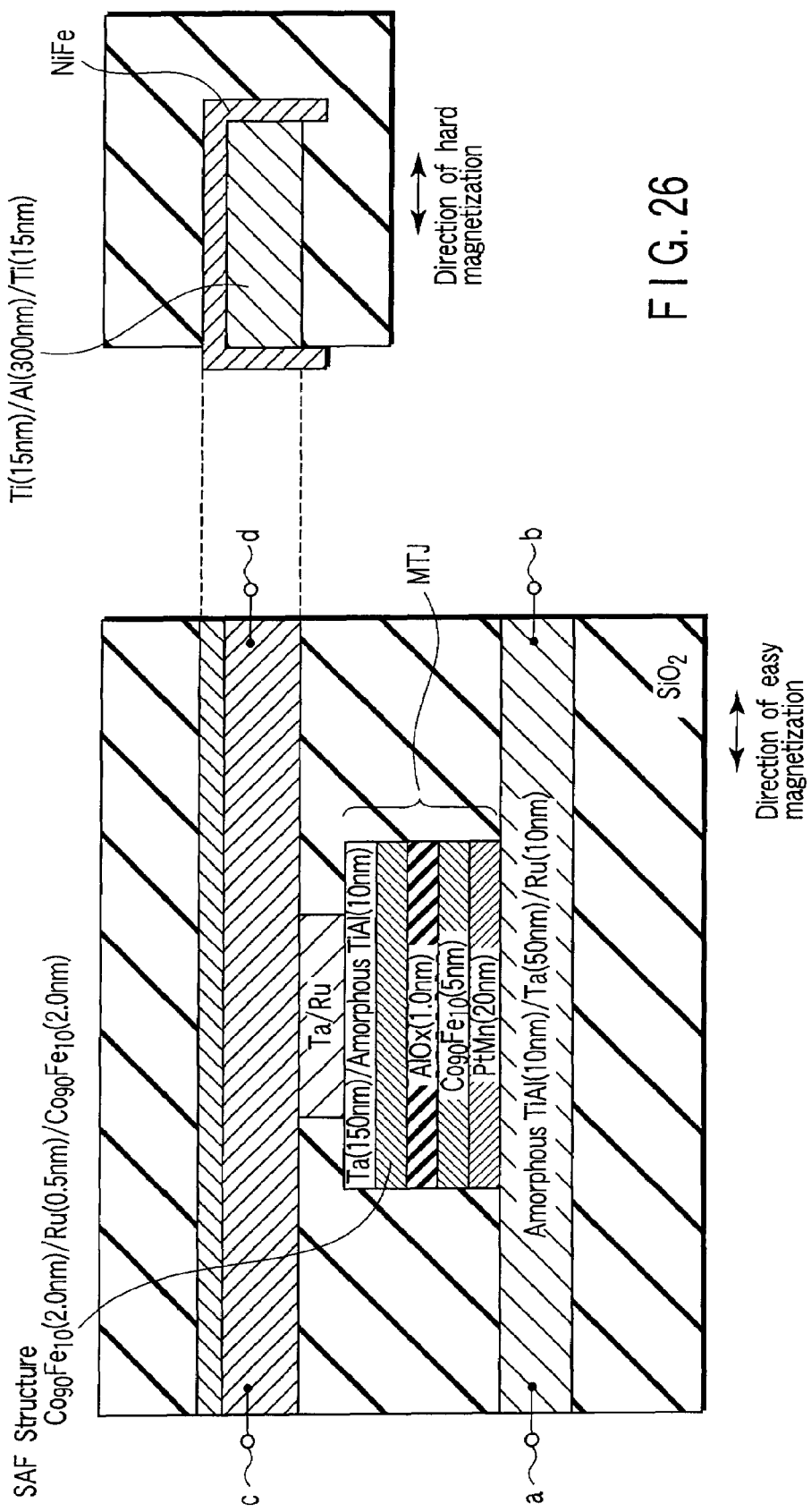
FIG. 26 is a sectional view showing a device structure of a fourth experimental example.

FIG. 26 shows a device structure in a fourth experimental example.

A lower electrode 15 is constituted of a laminate of amorphous TiAl (10 nm)/Ta (50 nm)/Ru (10 nm). A magnetoresistive element MTJ is formed on the lower electrode 15.

An antiferromagnetic layer of the magnetoresistive element MTJ is constituted of PtMn (20 nm). A magnetic pinned layer is constituted of $Co_{90}Fe_{10}$ (5 nm). A tunnel barrier layer is constituted of AlOx (1.0 nm). A magnetic recording layer is constituted of a synthetic ant-ferromagnetic (SAF) structure made of $Co_{90}Fe_{10}$ (2.0 nm)/Ru (0.5 nm)/$Co_{90}Fe_{10}$ (2.0 nm). Moreover, a contact layer is constituted of a laminate of Ta (150 nm)/amorphous TiAl (10 nm).

These materials are successively formed by, for example, a sputtering process.

To be more specific, the tunnel barrier layer is constituted of AlOx (1.0 nm) by repeating twice a process of forming Al having a thickness of 0.5 nm by the sputtering process, and naturally oxidizing the material in-situ by use of pure oxygen.

Here, two ferromagnetic layers $Co_{90}Fe_{10}$ of the SAF structures are equal to each other in thickness, and a structure having well-balanced magnetization is constituted, but the magnetizations may be varied from each other by, for example, changing the thickness, the material or the like.

When the thickness of AlOx was checked with a sectional transmission electron microscope (TEM) after completing the device, the thickness of AlOx increased from 1.0 nm to 1.2 nm. This is supposedly caused by the natural oxidation after forming AlOx (1.0 nm).

As to a tunnel junction of the magnetoresistive element MTJ, patterns are transferred to a portion defining a junction area by use of an electron beam (EB) drawing device, and to another portion by use of a KrF stepper device. Thereafter, the junction is separated using Ar ion milling to form a tunnel junction.

An upper bit line BLu/write assist line AL is formed on the magnetoresistive element MTJ via a contact layer 16.

The contact layer 16 is constituted of a laminate of Ta/Ru, and the upper bit line BLu/write assist line AL is constituted of a laminate of Ti (15 nm)/Al (300 nm)/Ti (15 nm), and has a yoke structure whose top and sides are coated with a high-permeability magnetic material (NiFe).

One-axis anisotropy is imparted to the magnetic recording layer of the magnetoresistive element MTJ by annealing the layer at about 280° C. for about ten hours while applying a magnetic field in a longitudinal-axis direction of the magnetic recording layer.

As to such sample, a value of a spin-injection current required for magnetization reversal is verified.

First, a value of a magnetic field Hx of a direction of an easy magnetization and that of a magnetic field Hy of a direction of a hard magnetization are determined, and applied as an assist magnetic field to the magnetoresistive element MTJ. Next, a pulse voltage is applied to the magnetoresistive element MTJ to pass the spin-injection current. Moreover, in this case, a resistance value of the magnetoresistive element MTJ is measured by a direct-current four-terminal process.

The above-described steps were repeatedly performed, and a relation between a path and a value of the spin-injection current was compiled. As a result, it has been found that the value of the spin-injection current required for the magnetization reversal is 3.9 mA in a case where a pulse voltage is applied between a terminal a of the lower electrode 15 and a terminal d of the upper bit line BLu/write assist line AL, whereas the value of the spin-injection current required for the magnetization reversal is 3.4 mA in a case where a pulse voltage is applied between the terminal a of the lower electrode 15 and a terminal c of the upper bit line BLu/write assist line AL.

This means that even in a case where the SAF structure is adopted in the magnetic recording layer of the magnetoresistive element MTJ, when the path of the spin-injection current (assist current) turns 180-degrees in a position of the magnetoresistive element MTJ, the value of the spin-injection current can be reduced.

As described above, even when the SAF structure is adopted, the spin-injection current can be reduced in a case where the path of the spin-injection current (assist current) turns 180-degrees in the position of the magnetoresistive element MTJ rather than a case where the path is constantly directed in only one direction in the vicinity of the magnetoresistive element MTJ.

Additionally, in the fourth experimental example, the upper bit line BLu/write assist line AL has the yoke structure, but considering an influence of a magnetic field generated from the upper bit line BLu/write assist line AL on a non-selected cell, the magnetic field applied from the lower electrode 15 to the magnetoresistive element is preferably set to be larger than that applied from the upper bit line BLu/write assist line AL to the magnetoresistive element.

This is because when the only lower electrode 15 is constituted into the yoke structure as in a structure shown in, for example, FIG. 13, the assist magnetic field can be effectively applied to the only selected magnetoresistive element. Consequently, the spin-injection current can be reduced by the magnetic field assist, and a problem of write disturbance can be avoided.

(5) Fifth Experimental Example

Figure 27:
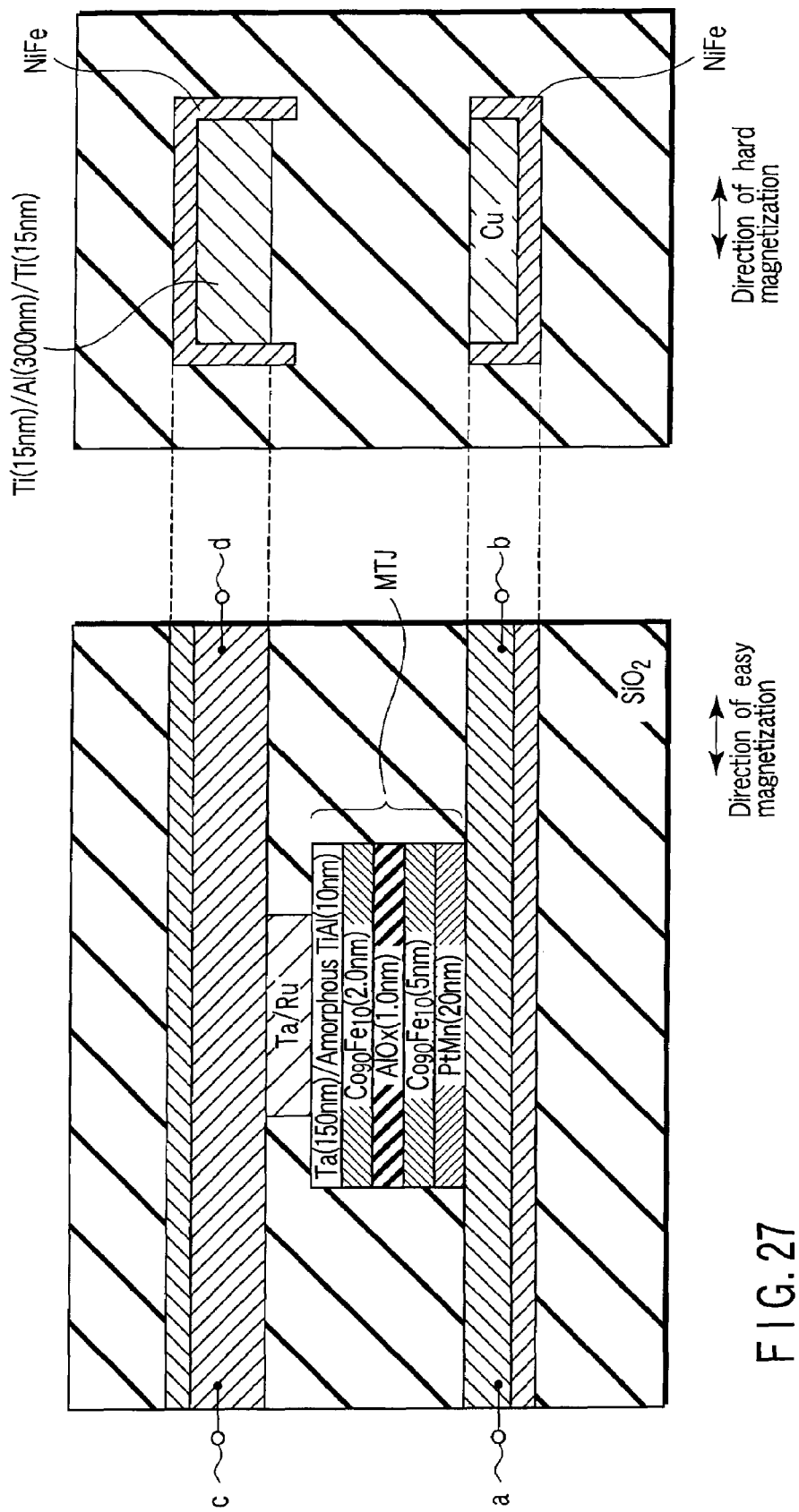
FIG. 27 is a sectional view showing a device structure of a fifth experimental example.

FIGS. 27 to 29 show a device structure in a fifth experimental example.

A lower electrode 15 is constituted of Cu, and has a yoke structure whose underside and sides are coated with a high-permeability magnetic material (NiFe). A magnetoresistive element MTJ is formed on the lower electrode 15.

An antiferromagnetic layer of the magnetoresistive element MTJ is constituted of PtMn (20 nm). A magnetic pinned layer is constituted of $Co_{90}Fe_{10}$ (5 nm). A tunnel barrier layer is constituted of AlOx (1.0 nm). A magnetic recording layer is constituted of $Co_{90}Fe_{10}$ (2.0 nm). Moreover, a contact layer is constituted of a laminate of Ta (150 nm)/amorphous TiAl (10 nm).

These materials are successively formed by, for example, a sputtering process.

To be more specific, the tunnel barrier layer is constituted of AlOx (1.0 nm) by repeating twice a process of forming Al having a thickness of 0.5 nm by the sputtering process, and naturally oxidizing the material in-situ by use of pure oxygen.

Moreover, when the thickness of AlOx was checked with a sectional transmission electron microscope (TEM) after completing the device, the thickness of AlOx increased from 1.0 nm to 1.2 nm. This is supposedly caused by the natural oxidation after forming AlOx (1.0 nm).

As to a tunnel junction of the magnetoresistive element MTJ, patterns are transferred to a portion defining a junction area by use of an electron beam (EB) drawing device, and to another portion by use of a KrF stepper device. Thereafter, the junction is separated using Ar ion milling to form a tunnel junction.

A plane shape of the magnetoresistive element MTJ is a cross shape shown in FIG. 28, or a bean shape (or C-shape) shown in FIG. 29.

An upper bit line BLu/write assist line AL is formed on the magnetoresistive element MTJ via a contact layer 16.

The contact layer 16 is constituted of a laminate of Ta/Ru, and the upper bit line BLu/write assist line AL is constituted of a laminate of Ti (15 nm)/Al (300 nm)/Ti (15 nm), and has a yoke structure whose top and sides are coated with a high-permeability magnetic material (NiFe).

One-axis anisotropy is imparted to the magnetic recording layer of the magnetoresistive element MTJ by annealing the layer at about 280° C. for about ten hours while applying a magnetic field in a longitudinal-axis direction of the magnetic recording layer.

As to such sample, when a value of a spin-injection current required for magnetization reversal was verified, the same result as that of the third experimental example could be obtained. That is, when the lower electrode 15 and the upper bit line BLu/write assist line AL are constituted into the yoke structures, and a path of the spin-injection current (assist current) turns 180-degrees in a position of the magnetoresistive element MTJ, the spin-injection current can be reduced.

Moreover, according to the fifth experimental example, when the plane shape of the magnetoresistive element MTJ is formed into the cross shape or the bean shape, stability against an external magnetic field, and resistance to thermal disturbance are improved.

It is to be noted that in addition, when the plane shape of the magnetoresistive element MTJ is formed into a parallelogram, a trapezoidal shape, a propeller shape which is a deformation of the cross shape, a shape obtained by combining two or more C-shapes, or the like, similar effects can be confirmed.

Furthermore, this also applies to the experimental examples other than the fifth experimental example in respect of the plane shape of the magnetoresistive element MTJ.

3. Others

According to the example of the present invention, reduction of a spin-injection current can be realized by a new architecture and write method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A spin-injection magnetic random access memory comprising:
    a magnetoresistive element;
    an electrode having a first end and a second end, which extends to a direction of an easy magnetization of the magnetoresistive element, the first end connecting to one end of the magnetoresistive element;
    a transistor connecting to the second end of the electrode; and
    a bit line connecting to the other end of the magnetoresistive element, which extends to the direction of the easy magnetization of the magnetoresistive element,
    wherein a direction of a hard magnetization of the magnetoresistive element is perpendicular to the direction of the easy magnetization of the magnetoresistive element.

2. The memory according to claim 1, wherein the electrode and the bit line are a path of a spin-injection current to generate spin-polarized electrons in the magnetoresistive element.

3. The memory according to claim 2, wherein the electrode and the bit line are a path of a write assist current to generate a magnetic field of the direction of the hard magnetization of the magnetoresistive element.

4. The memory according to claim 3, wherein the write assist current is different from the spin-injection current.

5. The memory according to claim 2, wherein the spin-injection current turns 180-degrees at a position of the magnetoresistive element.

6. The memory according to claim 3, wherein the write assist current turns 180-degrees at a position of the magnetoresistive element.

7. The memory according to claim 1, wherein the electrode has a yoke structure.

8. The memory according to claim 7, wherein the yoke structure is comprised of a yoke material which covers a bottom surface and side surfaces of the electrode.

9. The memory according to claim 8, wherein the yoke material protrudes upwards from a top of the electrode.

10. The memory according to claim 1, wherein the bit line has a yoke structure.

11. The memory according to claim 10, wherein the yoke structure is comprised of a yoke material which covers a top surface and side surfaces of the bit line.

12. The memory according to claim 11, wherein the yoke material protrudes downwards from a bottom of the bit line.

13. The memory according to claim 3, wherein the write assist current is cut off before the spin-injection current is cut off.

14. The memory according to claim 3, wherein the write assist current is smaller than the spin-injection current.

15. The memory according to claim 1, wherein a plane shape of the magnetoresistive element has one selected from a group which includes a cross shape and a bean shape.

16. The memory according to claim 1, wherein an intermediate layer is provided right under or above the magnetoresistive element.

17. The memory according to claim 16, wherein the intermediate layer is comprised of one selected from a group which includes an amorphous metal and a micro crystal metal.

18. The memory according to claim 17, wherein the intermediate layer is an alloy comprising one element selected from a group which includes Ti, Zr, Hf, V, Nb, Ta, Cr, Mo, and W.

19. The memory according to claim 17, wherein the intermediate layer is an alloy comprising one element selected from a group which includes Pt, Pd, Ru, Rh, Ir, Os, Re, Au, and Al.

20. The memory according to claim 17, wherein the intermediate layer is an alloy comprising one element selected from a group which includes Fe, Ni, Cr and Cu.

21. The memory according to claim 17, wherein the intermediate layer is an alloy comprising one element selected from a group which includes Pr, Nd, Pm, Sm, Eu, Gd, Tb, Dy, Ho, Er, Tm, Yb, and Lu.

* * * * *